US008823572B2

(12) United States Patent
Lemkin

(10) Patent No.: US 8,823,572 B2
(45) Date of Patent: Sep. 2, 2014

(54) ANTI-ALIASING SAMPLING CIRCUITS AND ANALOG-TO-DIGITAL CONVERTER

(71) Applicant: Dust Networks, Inc., Hayward, CA (US)

(72) Inventor: Mark Alan Lemkin, Berkeley, CA (US)

(73) Assignee: Dust Networks, Inc., Hayward, CA (US)

( * ) Notice: Subject to any disclaimer, the term of this patent is extended or adjusted under 35 U.S.C. 154(b) by 0 days.

(21) Appl. No.: 13/717,377

(22) Filed: Dec. 17, 2012

(65) Prior Publication Data

US 2014/0168000 A1    Jun. 19, 2014

(51) Int. Cl.
    *H03M 1/12*    (2006.01)
(52) U.S. Cl.
    USPC .......................... 341/155; 341/122; 341/172
(58) Field of Classification Search
    USPC .................. 341/172, 122, 155, 163, 159, 144
    See application file for complete search history.

(56) References Cited

U.S. PATENT DOCUMENTS

| | | | | |
|---|---|---|---|---|
| 6,753,801 | B2 * | 6/2004 | Rossi | 341/161 |
| 7,595,666 | B2 * | 9/2009 | Braswell et al. | 327/96 |
| 7,658,612 | B2 * | 2/2010 | Lee et al. | 439/37 |
| 7,889,111 | B2 * | 2/2011 | Kawahito | 341/162 |
| 7,990,209 | B2 * | 8/2011 | Romero | 327/556 |
| 8,106,987 | B1 * | 1/2012 | Vu et al. | 348/311 |
| 2012/0218053 | A1 | 8/2012 | Cook et al. | |

OTHER PUBLICATIONS

"Understanding Pipelined ADCs", Maxim Intergrated, Tutorial 1023, Oct. 2, 2001, pp. 1-8.
"Understanding SAR ADCs: Their Architecture and Comparison with Other ADCs", Maxim Intergrated, Tutorial 1080, Oct. 2, 2011, pp. 1-4.
Yuan et al., "A 10-bit 5-MS/s Successive Approximation ADC Cell Used in a 70-MS/s ADC Array in 1.2-μm CMOS", IEEE Journal of Solid-State Circuits, vol. 29, No. 8, Aug. 1994, pp. 866-872.
Liu et al., "A 10b 100MS/s 1.13mW SAR ADC with Binary-Scaled Error Compensation", 2010 IEEE International Solid State Circuits Conference, Session 21.5,pp. 386-388.
Razavi., "Successive Approximation Architectures", Section 6.7, Principles of Data Conversion System Design, IEEE Press, 1995, pp. 143-147.

* cited by examiner

*Primary Examiner* — Peguy Jean Pierre
(74) *Attorney, Agent, or Firm* — McDermott Will & Emery LLP

(57) ABSTRACT

A sampling circuit, such as the sampling circuit of a successive approximation analog-to-digital converter (ADC), provides anti-aliasing filtering of a sampled input signal. The circuit samples the input signal using multiple capacitors, wherein each capacitor samples the input signal at a distinct time during a sampling time interval. The circuit combines the samples stored on different capacitors during a conversion time interval, and generates a digital output signal using the combined samples. In one example, a first bit of the output signal is generated using a sample stored on a first capacitor, and second bit of the output signal is generated using a sample stored on a second capacitor. In another example, the circuitry performs finite or infinite impulse response (FIR or IIR) filtering of the input signal, where a filter characteristic is determined by the relative sizes of the capacitors used for sampling.

30 Claims, 19 Drawing Sheets

Prior Art

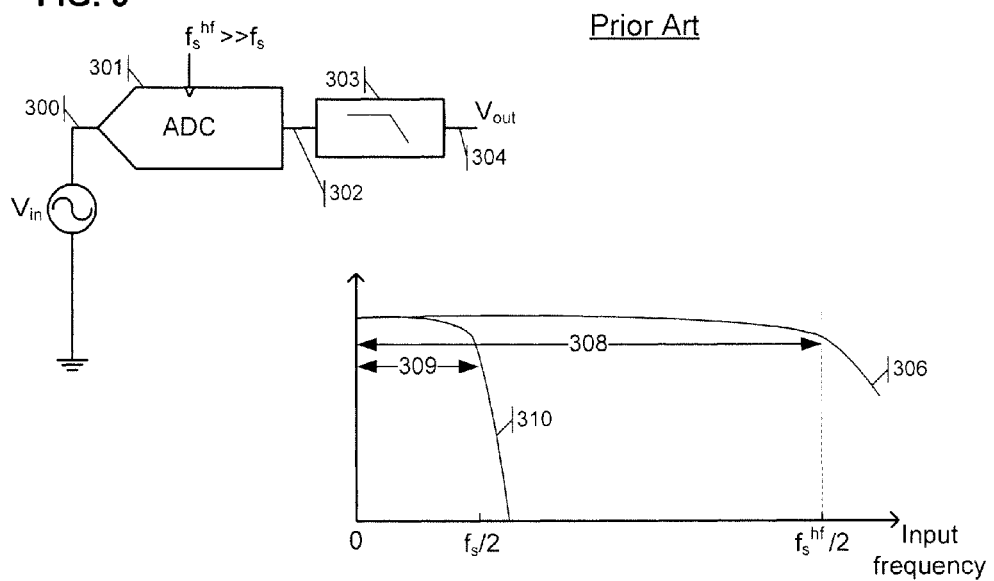
FIG. 3 — Prior Art

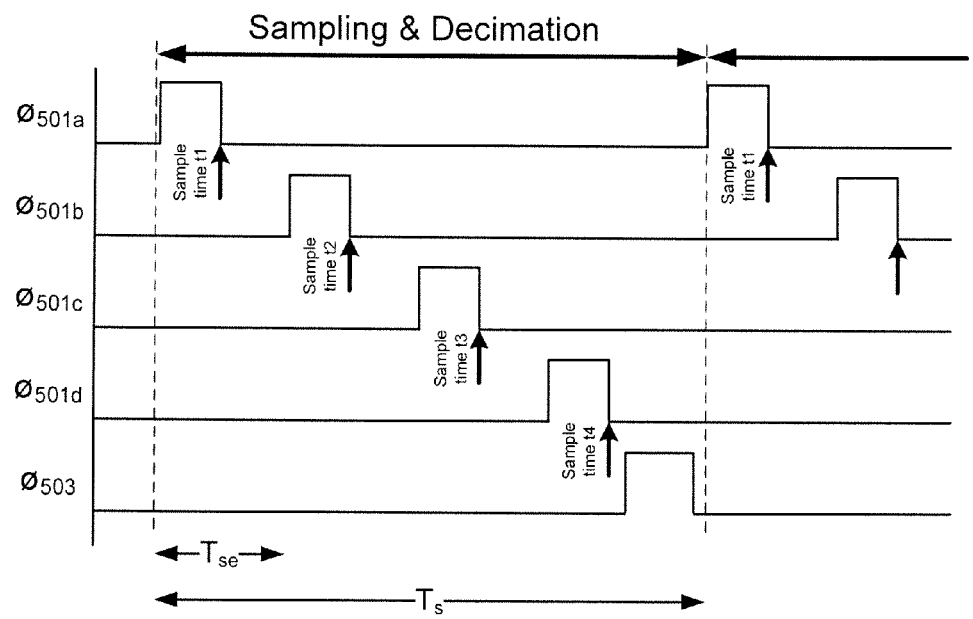

FIG. 7A  700

| $C_A$ | $C_B$ | $C_B$ | $C_A$ |
|---|---|---|---|
| $C_C$ | $C_D$ | $C_D$ | $C_C$ |
| $C_C$ | $C_D$ | $C_D$ | $C_C$ |
| $C_A$ | $C_B$ | $C_B$ | $C_A$ |

FIG. 7B

| $C_8$ | $C_4$ | $C_4$ | $C_8$ |
|---|---|---|---|
| $C_8$ | $C_2$ | $C_D$ | $C_8$ |
| $C_8$ | $C_1$ | $C_2$ | $C_8$ |
| $C_8$ | $C_4$ | $C_4$ | $C_8$ |

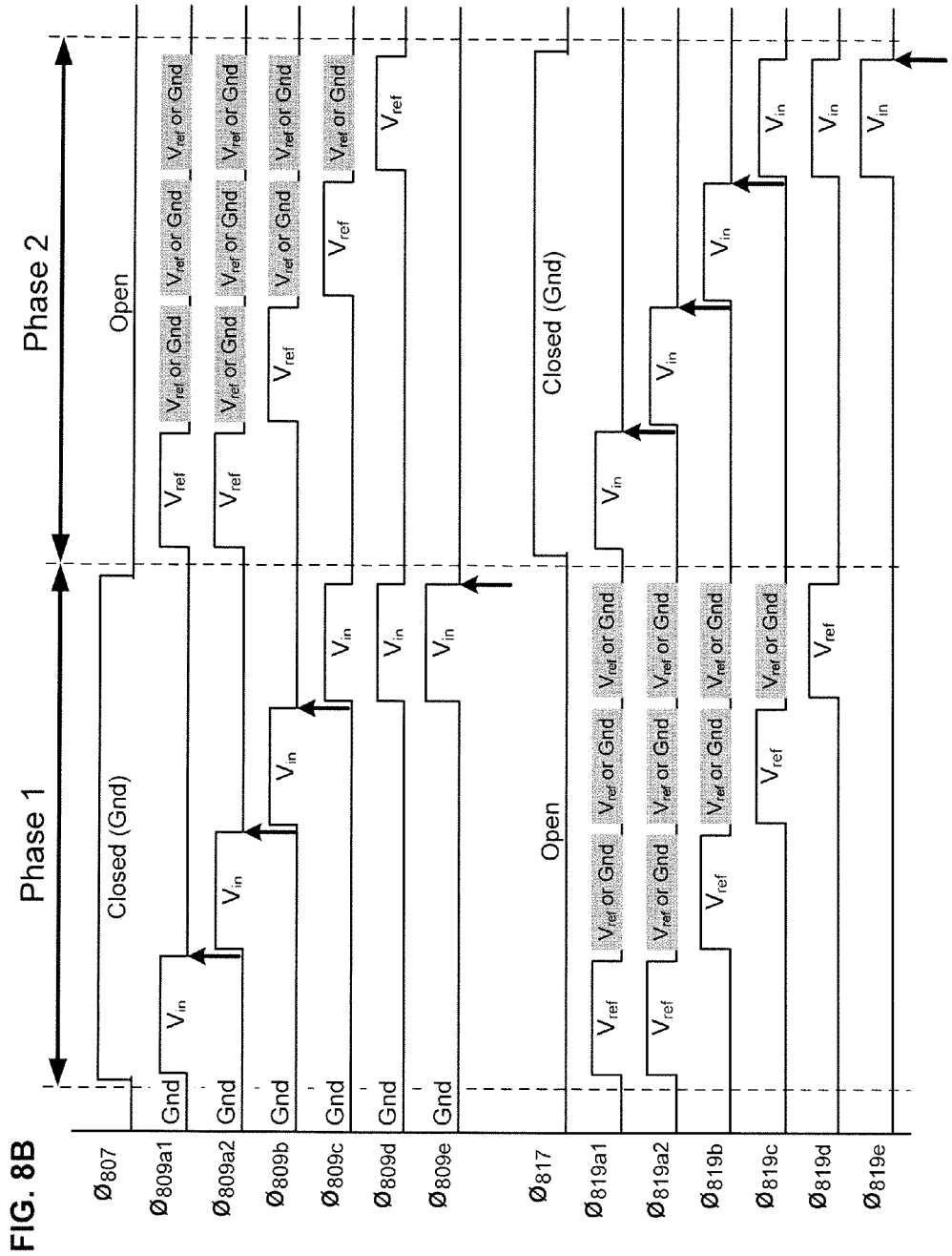

US 8,823,572 B2

ANTI-ALIASING SAMPLING CIRCUITS AND ANALOG-TO-DIGITAL CONVERTER

TECHNICAL FIELD

The present subject matter relates to techniques and equipment for improving the accuracy and reducing the noise sensitivity of sampling circuits, such as sampling circuits forming part of analog-to-digital converters.

BACKGROUND

A sampling circuit, such as an analog to digital converter (ADC), converts a continuous time signal into a discrete time signal formed of a sequence of discrete signal samples. In the case of an ADC, each discrete signal sample is further digitized into a binary string representative of the discrete signal sample value to form a digital output signal. The sampling circuit commonly uses a capacitor (or other charge storage device) to sample the continuous time input signal value at a given instant in time. The sampling circuit passes the sampled signal value to a conversion circuit, or otherwise makes use of the sampled signal value stored on the capacitor.

The sampling circuit operates at a determined sampling rate $f_s$ to take one sample of the continuous time input signal every $1/f_s$ seconds. The sample rate is application dependent and specifies the frequency at which the input signal is sampled for conversion to a digital word. In order to sample a continuous-time signal and avoid aliasing, the sampling rate $f_s$ must be at least twice the highest frequency of the continuous-time signal. If the sampling rate $f_s$ is not twice the highest frequency of the continuous-time signal, aliasing or folding of high-frequency components of the input signal into the post-sampling bandwidth occurs according to Nyquist's sampling theorem. These folding effects introduce noise and error into the sampled signal, and must be addressed to prevent undesired signals and undesired noise from appearing in-band.

FIG. 1 illustrates an ADC 103 sampling an input signal $V_{in}$. $V_{in}$ is converted as expected between a frequency of 0 and $f_s/2$. However above $f_s/2$ in region A, the input signal, which may be a random (noise) or a deterministic signal, is folded between $f_s/2$ and 0. Thus, an input signal component with a frequency of $f_s$ gets folded back and appears as a DC signal. As the frequency increases into region B (beyond region A), the input signal energy gets folded back and forth across the output bandwidth of 0 to $f_s/2$.

FIG. 2 illustrates a method of reducing the effects of aliasing. A low pass filter 201 takes the input signal 200 and filters out or attenuates the frequency components that will be aliased according to transition and stopband attenuation 206, presenting this band-limited signal to an input 202 of the ADC 203. Because the input signal has reduced energy in region 210, the amount of energy that will be folded into the digital output is reduced, thereby providing for lower aliasing noise and improved performance. However, it is difficult to provide a filter with a sharp cutoff before the ADC 203. If an active filter is used for faster transition between pass-band and stop-band, additional noise is introduced by the active filter, additional current is required by the active filter, and the output of the active filter must be able to drive the input of the ADC 203.

FIG. 3 illustrates another method for addressing the effects of aliasing of an input signal. In FIG. 3, input signal 300 is sampled by ADC 301 at a rate $f_s^{hf}$ substantially higher than the bandwidth of interest 309 ($f_s^{hf} >> f_s$). Any signals above the bandwidth of interest but within bandwidth 308 are accurately sampled by the ADC and presented as a digital signal to output 302. The digital output 302 is filtered by a digital filter 303 (having a filter characteristic 310) and presented to output 304. In one example, filter 303 is a decimation filter with down-sampling. According to this method, aliasing is avoided by increasing the ADC sample rate over the rate required to convert signals in the bandwidth of interest. The out-of-band signals are then removed using the digital filter 303. An analog anti-aliasing filter having a low-pass characteristic 306 may be used in front of the ADC 301 to further prevent aliasing. By separating the bandwidth of interest farther from the point where aliasing starts to occur the design of an analog anti-aliasing filter may be greatly simplified, and the signal processing for filtering out of band signals may be performed in the digital domain, where sharper, more stable filter characteristics can be realized. However, in conjunction with increased computational power, the need for a faster ADC to oversample the input signal wastes substantial power.

A need therefore exists for energy-efficient circuits and methods for sampling of continuous time signals that have low sensitivity to noise, low sensitivity to aliasing, operate with low power consumption, and are capable of operating at high sampling rates.

SUMMARY

The teachings herein alleviate one or more of the above noted problems in sampling circuits caused by noise sensitivity and aliasing caused by high-frequency signals, including in sampling circuits forming part of analog-to-digital converters.

In a first example, a first capacitor is used to sample an analog input signal at a first time during a sampling time interval. A second capacitor is used to sample the analog input signal at a second time during the sampling time interval, wherein the second time is distinct from the first time. Circuitry combines the samples stored on the first and second capacitors, and generates a digital output signal using the combined samples during a conversion time interval distinct from the sampling time interval. The first capacitor may be formed of two or more sub-capacitors, and the circuitry may be operative to adjust the connectivity of the capacitors and/or sub-capacitors from a first configuration during the sampling time interval to a second configuration during the conversion time interval so as to generate a first and second bits of the digital output signal respectively using samples stored on first and second sub-capacitors of the first capacitor. The second configuration of the conversion time interval may connect the capacitors into first and second sets of capacitors, wherein the first set of capacitors has twice the capacitance value of the second set of capacitors. The circuitry operative to generate the digital output signal may form part of a successive approximation analog-to-digital converter, a sample and hold circuit, or a pipelined analog-to-digital converter.

A method may include sampling, by a first capacitor, an analog input signal at a first time during a sampling time interval; sampling, by a second capacitor, the analog input signal at a second time during the sampling time interval, wherein the second time is distinct from the first time; combining the samples taken at the first and second times; and generating a digital output signal using the combined samples during a conversion time interval distinct from the sampling time interval.

In a second example, a method includes selecting first and second sets of capacitors in a capacitor array, wherein a ratio of capacitance values of the first and second sets of capacitors corresponds to a ratio between tap coefficients of a desired anti-aliasing filter response. An analog input signal is sampled at first and second distinct times during a sampling time interval, respectively using the first and second sets of capacitors to obtain first and second samples of the analog input signal. The capacitors of the first and second sets are re-configured to form third and fourth sets of capacitors different from the first and second sets of capacitors. A digital output signal is output based on charge stored on the third and fourth sets of capacitors, wherein the digital output signal includes a first bit based on conversion of a charge stored on the capacitors of the third set of capacitors and a second bit based on conversion of a charge stored on the capacitors of the fourth set of capacitors. The method can be implemented using a capacitor array comprising a plurality of capacitors and selection circuitry for selectively coupling array capacitors together to form sets of capacitors; a converter for converting an average charge value stored on a set of capacitors to a bit value of a digital output signal; and a controller for controlling the operation of the capacitor array and the converter. The steps for selecting the first and second sets of capacitors and for sampling the analog input signal may include: for each selected set of the first and second sets of capacitors, sequentially performing steps of (i) for each capacitor in the selected set of capacitors, sequentially performing steps of activating a row selection line and a column selection line corresponding to a row and column of the capacitor in the array while maintaining a data line un-activated; and (ii) following the activating of the row and column selection lines for each capacitor in the selected set, applying the analog input signal to a signal line to sample the analog input signal on the capacitors of the selected set.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 3 shows an exemplary circuit including a high frequency analog-to-digital converter (ADC) and a post-conversion low pass filter, and a frequency response of the circuit illustrating reduced high-frequency aliasing.

FIGS. 5B and 5C show illustrative timing diagrams of control signals used for operating the sampling circuit of FIG. 5A.

FIGS. 7A and 7B show an illustrative capacitor array having adjustably connectable sub-capacitors for use with the sampling circuit or the SA-ADC of FIG. 5A or 6A.

FIG. 8B shows an illustrative timing diagram of control signals used for operating the SA-ADC having dual capacitor arrays of FIG. 8A.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various methods and circuits disclosed herein relate to improving the accuracy and reducing the noise sensitivity of sampling circuits, such as sampling circuits forming part of analog-to-digital converters. The methods and circuits increase the effective rate at which an input signal is sampled and, by recombining charge across capacitors or other storage devices used for sampling, provide anti-aliasing filtering of the input signal. In the case of analog-to-digital converters, the sampled signal is decimated prior to conversion to allow the conversion circuitry to operate at a rate lower than the effective sampling rate.

In one example, the methods and circuits can be used as part of a charge-redistribution analog-to-digital (ADC) converter. Anti-aliasing may be performed by the charge-redistribution ADC by sampling the input signal at a rate (i.e., the effective sampling rate) higher than the conversion rate, with each sample occurring on only a portion of the charge-redistribution capacitor array. The successive approximation charge-redistribution ADC (SA-ADC) then converts the sampled data to a digital word during a conversion phase. By sampling the input signal on the capacitor array over a plurality of shortened sampling periods, the high-frequency signal and noise is captured. An anti-aliasing filter characteristic is constructed using the capacitor array, and intrinsic decimation occurs as the converter converts the sampled signals at the conversion rate during the conversion phase.

Reference now is made in detail to the examples illustrated in the accompanying drawings and discussed below.

Figure 1:
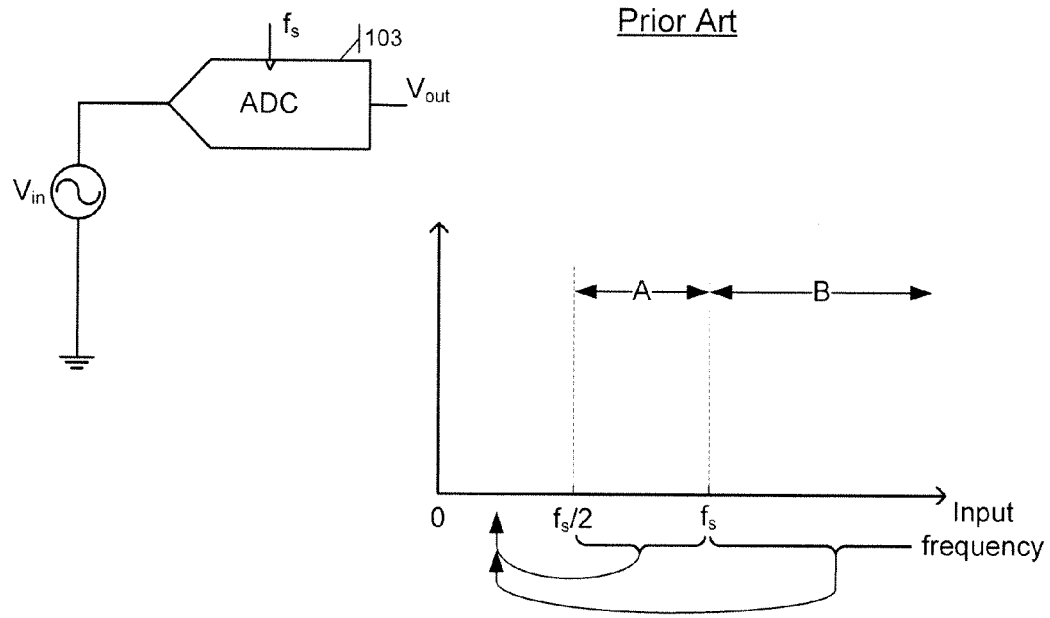
FIG. 1 shows an exemplary analog-to-digital converter (ADC) circuit subject to high-frequency aliasing, and a frequency response of the ADC circuit.
Figure 2:
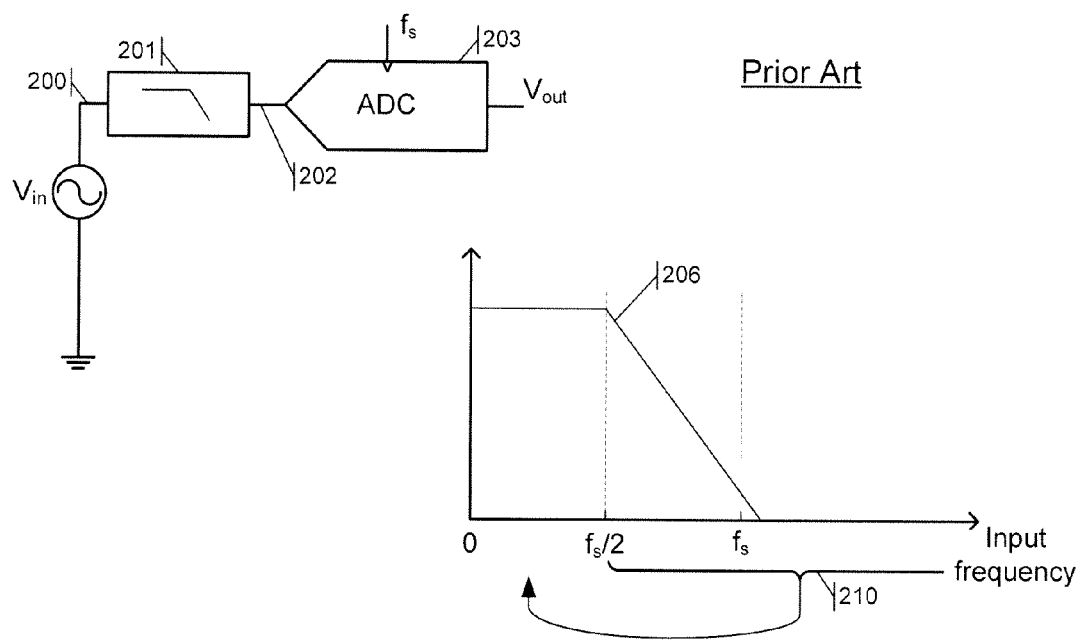
FIG. 2 shows an exemplary circuit including an analog-to-digital converter (ADC) and a pre-conversion low pass filter, and a frequency response of the circuit illustrating reduced high-frequency aliasing.
Figure 4A:
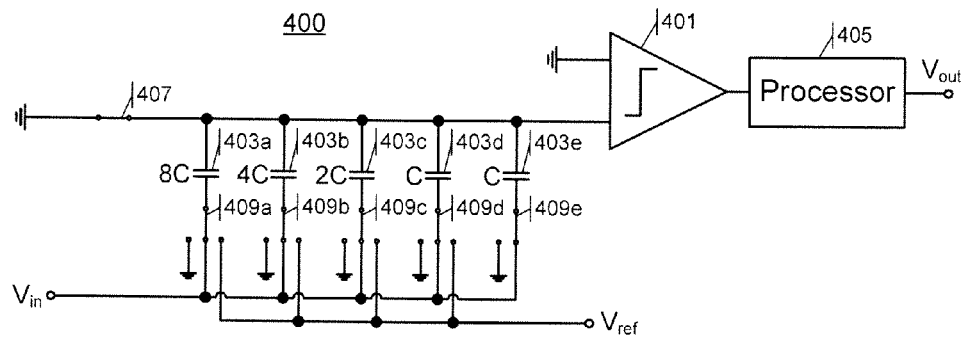
FIGS. 4A-4C show an illustrative successive approximation ADC (SA-ADC) circuit having a set of capacitors used to concurrently sample an input signal.
Figure 4B:
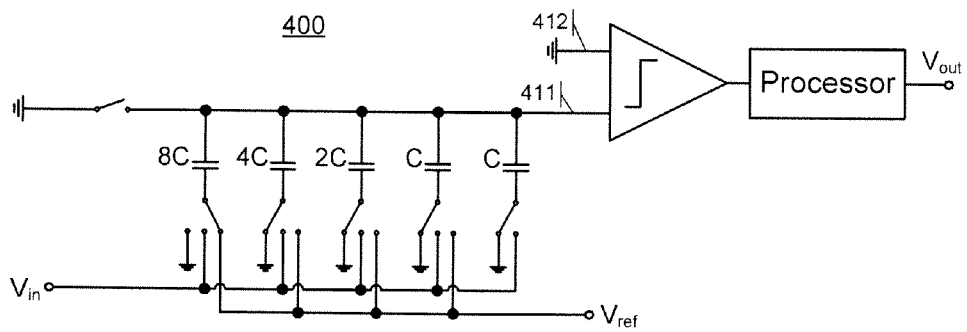
Figure 4C:
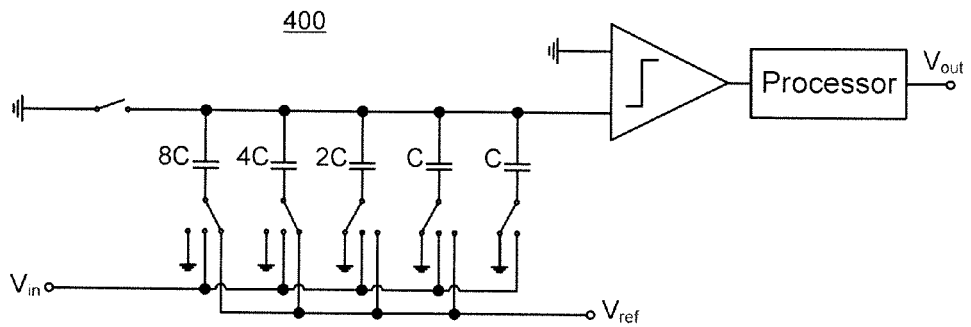

FIGS. 4A-4C show an illustrative successive approximation ADC 400 that uses a set of capacitors 403a-e to sample the signal at input $V_{in}$, and a comparator 401 (also referred to as a single-bit A/D converter, or a quantizer) and processing circuitry 405 for converting the sample signal and generating the digital output signal $V_{out}$. The processing circuitry 405 is configured to control the operation of the successive approximation ADC by generating control signals for opening and closing switches 407 and 409a-e. In general, the capacitors 403a-e have binary weighted capacitances selected such that $C_{403a}=2*C_{403b}$ (=8C, in the example of FIG. 4A); $C_{403b}=2*C_{403c}$ (=4C, in the example); $C_{403c}=2*C_{403d}$ (=2C, in the example); and a dummy capacitor 403e is set to have the same capacitance as the smallest capacitor $C_{403e}=C_{403d}$ (=C, in the example). In some embodiments the capacitors are not binary weighted; for example, sub-binary weighting the capacitors may be used to reduce missing codes. The SA-ADC 400 as shown is a 4-bit ADC producing a 4-bit output signal $V_{out}$ using four sampling capacitors (403a-d) and one dummy capacitor; more generally, a n-bit SA-ADC producing a n-bit output signal $V_{out}$ can use n sampling capacitors (having capacitance values of C, 2C, 4C, ... $2^{n-1}$C) and one dummy capacitor. In some embodiments, a dummy capacitor is not used.

Each of FIGS. 4A-4C show the successive approximation ADC 400 in a different state of operation. In FIG. 4A, the ADC is operating in a sampling state: switch 407 is closed to connect one node of each capacitor 403a-e to a fixed voltage level (e.g., ground), while switches 409a-e are closed to connect the other node of each capacitor 403a-e to the analog input voltage $V_{in}$. During the sampling phase, each of the capacitors 403a-e is charged to a voltage potential equal to $V_{in}$ (specifically, to store charge such that a voltage across the capacitor is equal to the instantaneous value of $V_{in}$ at the end of the sampling phase). At the conclusion of the sampling phase, switch 407 is opened, and each of switches 409a-e are set to connect to the fixed voltage level (e.g., ground). The voltage at node 411 is thus equal to $-V_{in}$.

Following the sampling phase, the ADC transitions to a conversion phase as shown in FIG. 4B. In the conversion phase, the ADC is controlled such that: switch 407 is open, and switches 409a-e are controlled such that each of the capacitors 403a-d (i.e., each capacitor except the dummy capacitor 403e) is connected in turn to a reference voltage level $V_{ref}$. The charge sharing between the capacitors 403a-d in response to changes in connectivity of switches 409a-e effects a digital to analog conversion (DAC) (SA-DAC), converting the digital input word into an analog output voltage (or charge). In one example, $V_{ref}$ may be set to an upper power supply voltage $V_{DD}$. In FIG. 4B, switch 409a is shown as connecting one node of capacitor 403a to the reference voltage node $V_{ref}$ while the remaining switches 409b-e connect one node of each capacitor 403b-e to ground. The comparator 401 is operated to perform a first comparison operation comparing the voltage at node 411 with a comparison voltage level at node 412 (e.g., a ground voltage). Based on the outcome of the first comparison detected by processor 405 at the output of comparator 401, the processor determines the most significant bit of the digital output signal. The processor proceeds to close switch 409b so as to connect one node of capacitor 403b to the reference voltage node $V_{ref}$ (as shown in FIG. 4C), while the remaining switches 409c-e connect one node of each capacitor 403c-e to ground. The status (open/closed) of switch 409a is determined based on the outcome of the first comparison: if the comparison yielded an outcome of 0, switch 409a remains connected to $V_{ref}$ (as illustratively shown in FIG. 4C); if the comparison yielded an outcome of 1, switch 409a connects one node of capacitor 403a to ground. The comparator 401 is operated to perform a second comparison operation and determine the next most significant bit of the digital output signal. The procedure is sequentially repeated until all bits of the digital output signal are determined.

At the conclusion of the conversion phase, the processor 405 outputs the digital output signal at node $V_{out}$. The successive approximation ADC is then ready to take another sample of the input signal $V_{in}$ by closing switch 407 and controlling switches 409a-e to connect a node of each capacitor 403a-e to the input voltage $V_{in}$, and returning to a sampling phase.

Figure 4D:
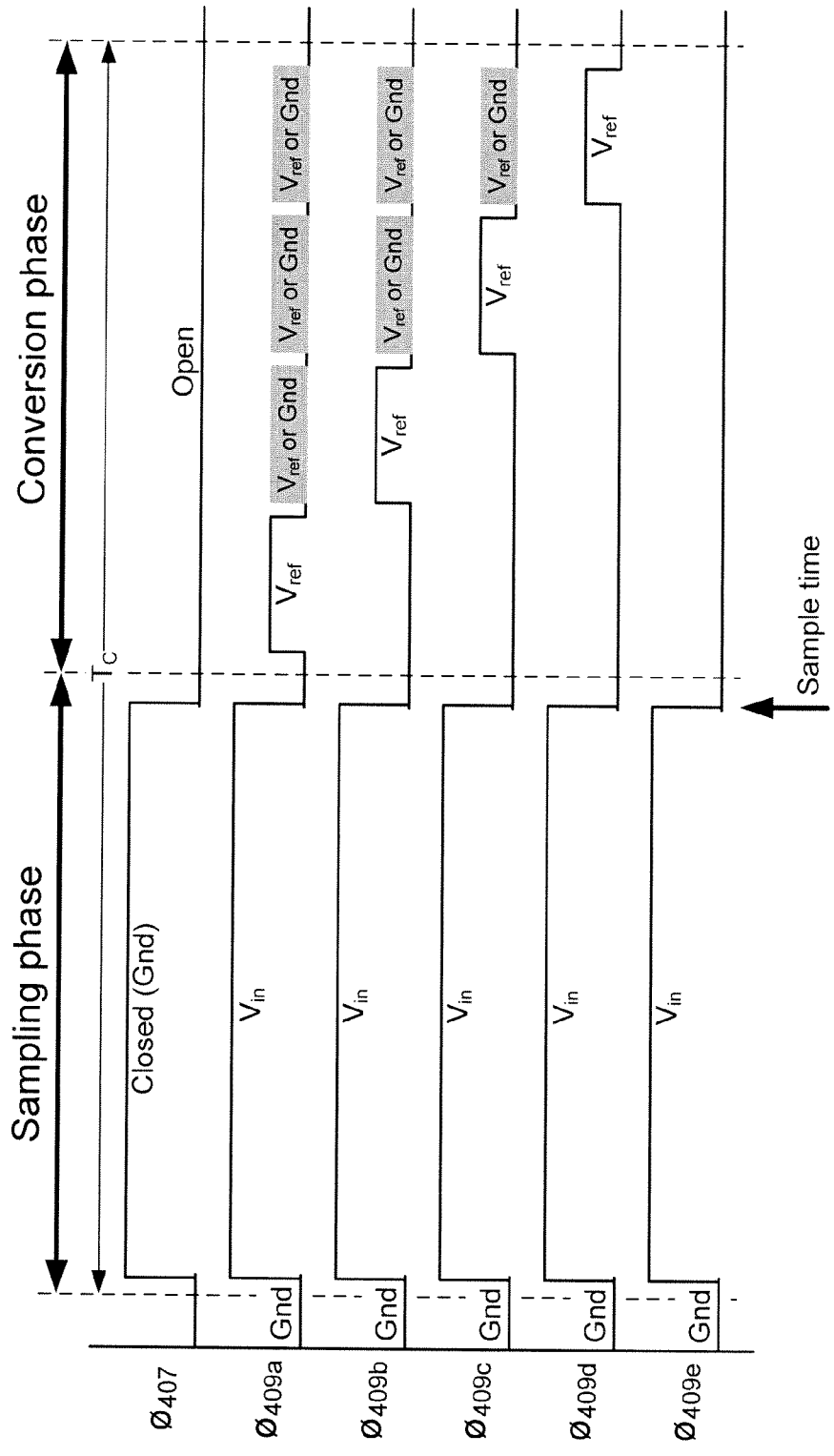
FIG. 4D shows an illustrative timing diagram of control signals used for operating the SA-ADC of FIGS. 4A-4C.

FIG. 4D shows an illustrative timing diagram of control signals used for controlling the state of switches 407 and 409a-e of circuit 400 during operation of the circuit. The control signals generally are output by processor 405 as part of a sampling and conversion operation. As shown in the timing diagram, the control signal $\varnothing_{407}$ controlling switch 407 is operative to close switch 407 (thereby connecting the capacitors 403a-e to ground) during a sampling phase, and to open the switch during a conversion phase. The control signals $\varnothing_{409a}$, $\varnothing_{409b}$, $\varnothing_{409c}$, $\varnothing_{409d}$, and $\varnothing_{409e}$ each control a respective one of switches 409a-e, and are operative to connect the switches to $V_{in}$ during a sampling phase. During the conversion phase, the control signals $\varnothing_{409a}$, $\varnothing_{409b}$, $\varnothing_{409c}$, $\varnothing_{409d}$, and $\varnothing_{409e}$ connect to the ground node, and sequentially operate to connect their respective capacitor to the reference voltage node $V_{ref}$ during respective conversion operations. In some embodiments the control signals don't connect the capacitors 403a-e to the ground node before the sequential conversion operations.

The time interval $T_C$ between two sampling phases determines the conversion rate $f_C=1/T_C$ of the ADC 400. In addition, the time interval between two conversion phases determines the sampling rate $f_S$ of the ADC 400. In the example of FIGS. 4A-4C, the time interval between two conversion phases is equal to the time interval between two sampling phases, such that the conversion rate is equal to the sampling rate $f_C=f_S$.

In order to improve the anti-aliasing characteristics of the successive approximation ADC, the effective sampling rate $f_{se}$ of the ADC can be increased. Specifically, anti-aliasing may be performed by a charge-redistribution ADC by sampling the input signal at an effective sampling rate $f_{se}$ higher than the conversion rate $f_C$, with each sample being taken on only a portion of the charge-redistribution capacitor array. Multiple samples are thus taken during each sampling time interval (i.e., the sampling phase), and each sample is taken on only a portion of the charge-redistribution array. This sampling method is in contrast to the sampling performed in successive approximation charge-redistribution ADC 400 shown and described in relation to FIGS. 4A-4D, in which all of the capacitors 403a-e in the array simultaneously sample the input signal at the same time. By instead sampling the input signal on different capacitors in the array during a plurality of sampling periods, the high-frequency energy of the input signal is captured and can be processed by an anti-aliasing filter characteristic of the sampling and conversion circuitry with intrinsic decimation occurring during the conversion phase. The decimation ratio is the ratio of the effective sampling rate $f_{se}$ to the conversion rate $f_c$. Various anti-aliasing filter characteristics may be constructed as described in more detail below.

Figure 5A:
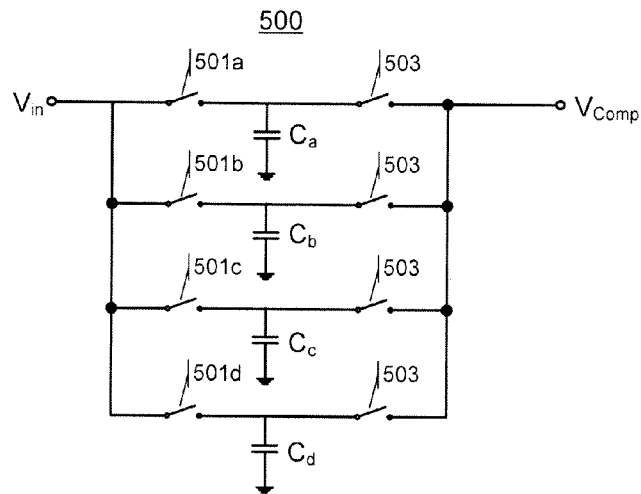
FIG. 5A shows an illustrative sampling circuit having a set of capacitors used to sequentially sample an input signal.

FIG. 5A shows an illustrative sampling circuit 500 for separately sampling an analog input signal $V_{in}$, at distinct times, on a plurality of capacitors $C_{a-d}$. In the circuit 500, each capacitor $C_{a-d}$ is selectively coupled to a node receiving the input voltage $V_{in}$ by a corresponding switch 501a-d. A first capacitor $C_a$ may thus be coupled to the input voltage node during a first time interval in order to sample the input voltage $V_{in}$ at a first sampling time by closing switch 501a during the first time interval and opening switch 501a at the first sampling time. Similarly, each of the capacitors $C_{b-d}$ can be coupled to the input voltage node during respective second, third, and fourth time intervals in order to sample the input voltage $V_{in}$ at respective second, third, and fourth sampling times by operating respective switches 501b-d. Specifically, each switch 501b-d can respectively be closed during the corresponding second, third, or fourth time interval, and opened at the respective second, third, and fourth sampling time. Once input signal samples (and corresponding charges) have been stored on each of the capacitors 501a-d, switches 503 can be closed in order to recombine charge between the capacitors and couple the capacitors to an output node $V_{Comp}$ for further processing. While circuit 500 shows an illustrative circuit including four capacitors, various numbers of capacitors can be used (e.g., two or three capacitors, or more than four capacitors). In general, each capacitor $C_n$ has a corresponding switch 501n for coupling the capacitor to the input node $V_{in}$, and a corresponding time interval during which the switch 501n is closed to sample the input signal onto the capacitor. In some embodiments capacitors Ca-Cd are bottom plate sampled. Bottom plate sampling is a well-known technique by those skilled in the art.

Figure 5B:
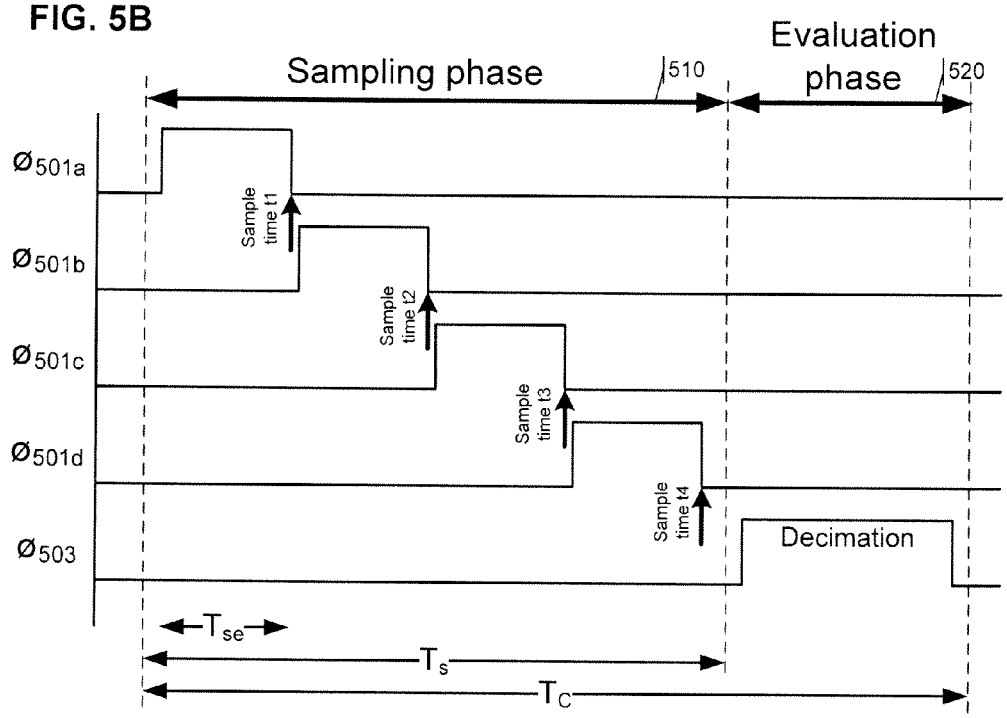

FIG. 5B shows an illustrative timing diagram of control signals used for controlling the state of switches 501a-d and 503 of circuit 500 during operation of the sampling circuit. As shown in the timing diagram, each of switches 501a-d is closed during a distinct one of four time intervals of the sampling phase 510, each time interval ending with the corresponding sample time t1-t4. In general, the sample times t1-t4 may be evenly distributed during the sampling phase such that time intervals separating subsequent sample times are equal to each other: [t1, t2]=[t2, t3]=[t3, t4]. Once all samples have been taken, the circuit 500 transitions to an evaluation phase 520 during which operations can be performed on the samples stored on the capacitors $C_{a-d}$. In the example of FIGS. 5A-5B, the evaluation phase begins with switches 503 connecting all capacitors $C_{a-d}$ to an output node $V_{Comp}$ of sampling circuit being closed. The closing of switch 503 can cause charge stored on each of the capacitors during the sampling phase to be combined and averaged between the capacitors, such that the same voltage is across each capacitor.

The illustrative sampling circuit 500 and timing diagram shown in FIGS. 5A and 5B illustrate an embodiment of a circuit that implements a filter having a finite impulse response (FIR) characterized by coefficients [1 1 1 1]. In the example, four capacitors $C_{a-d}$ of equal size and capacitance value C sample input signal $V_{in}$ in sequence according to the timing diagram shown in FIG. 5B. During sampling period 510, the four sampling capacitors sample input signal $V_{in}$ with an equal spacing between the sampling instants (although other embodiments may sample with unequally spaced intervals). After the input signal is sampled by the four capacitors, the capacitors are placed in parallel by closing switch 503 to combine charge and perform decimation. The output signal at node $V_{Comp}$ during the evaluation/decimation phase may be calculated based on the charge stored on each capacitor at each sample time:

$$Q_{TOT}=C_a*V_{in}+C_c*V_{in}z^{-1}+C_b*V_{in}z^{-2}+C_a*V_{in}z^{-3}$$

In examples in which $C_a=C_b=C_c=C_d=C$, $$Q_{TOT}=C*V_{in}+C*V_{in}z^{-1}+C*V_{in}z^{-2}+C*V_{in}z^{-3}$$

This provides an output voltage $V_{Comp}$ as follows during the evaluation phase:

$$V_{Comp}=Q_{TOT}/(4*C)=\tfrac{1}{4}V_{in}(1+z^{-1}+z^{-2}+z^{-3})$$

The illustrative sampling circuit 500 is thus equivalent to a 4-tap sinc1 filter with unity DC gain. Since $\varnothing_{503}$ runs at the conversion rate $f_C$ ($f_C=1/T_C$), which is lower than ¼ of the effective sample rate $f_{se}$ (the effective sample rate $f_{se}$ ($f_{se}=1/T_{se}$) being determined by the rate of occurrence of sample times t1-t4), decimation is seamlessly performed. In some embodiments, the length of the sampling intervals in signals $\varnothing_{501a}$, $\varnothing_{501b}$, $\varnothing_{501c}$, and $\varnothing_{501d}$ is reduced (e.g., to less that ¼ of the sample phase period $T_s$) so that the pulse in $\varnothing_{503}$ may be inserted within a sample period $T_s$, thereby enabling both sampling and decimation to be performed with a constant sample rate $f_s$ equal to the conversation rate $f_C$, as shown in FIG. 5C. In some embodiments, the ADC conversion occurs during the decimation time interval.

While the exemplary circuit of FIG. 5A has been described as having equally sized capacitors $C_a=C_b=C_c=C_d=C$, the circuit can more generally include capacitors with different capacitance values. In one example in which each capacitor $C_r$ has a capacitance value of n, the sampling circuit 500 provides an output signal according to:

$$V_{Comp}=\alpha*V_{in}(d+c*z^{-1}+b*z^{-2}+a*z^{-3}) \text{ where } \alpha=1/(a+b+c+d)$$

Figure 6A:
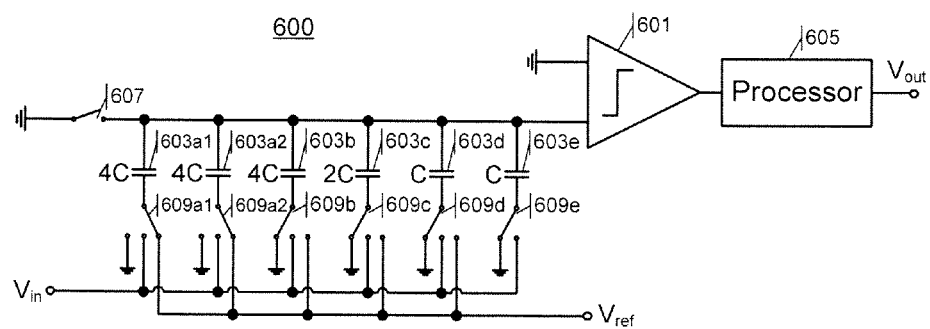
FIG. 6A shows an illustrative SA-ADC circuit having a set of capacitors used to sequentially sample an input signal.

The principle of operation of the sampling circuit 500 can be applied to sampling circuitry used in conjunction with an analog-to-digital converter (ADC). FIG. 6A illustrates a 4-bit charge redistribution successive approximation ADC 600 with a binary weighted capacitor array, including a comparator 601 (or quantizer) and a processor 605 respectively for converting an average charge value stored on various combinations of capacitors 603a-e to a digital output signal $V_{out}$, and for controlling the operation of the capacitors 603a-e, switches 607 and 609a-3, and the quantizer 601. The binary weighted capacitor array includes capacitors 603a-d having capacitance values in ratio of 8C, 4C, 2C, 1C and a dummy capacitor 603e also having a weight of 1C. As shown, the largest capacitor 603a having a capacitance of 8C is formed of two separate sub-capacitors 603a1 and 603a2 each having capacitance values in ratio of 4C. Capacitors 603b, 603c, and 603d are formed of capacitors having respective capacitances values in ratio of 4C, 2C, and 1C. Note that in various embodiments, at least some of the capacitors are constructed from sub-capacitors (e.g., unit capacitors), a two-step DAC is used, a split-capacitor array is used, or any other appropriate capacitor array or capacitor arrays is used.

Figure 6B:
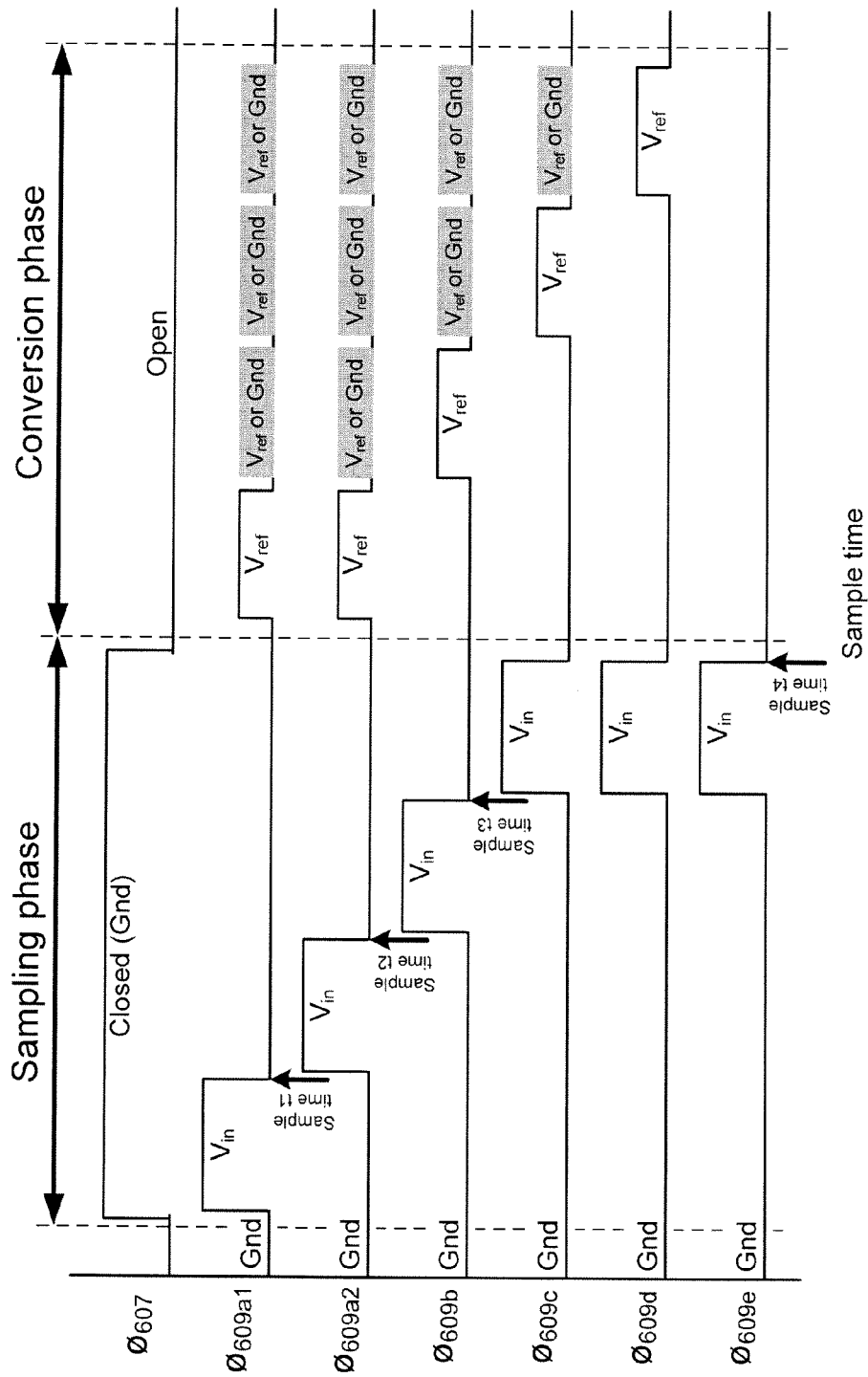
FIG. 6B shows an illustrative timing diagram of control signals used for operating the SA-ADC of FIG. 6A.

FIG. 6B shows an illustrative timing diagram of control signals used for controlling the state of switches 609a-e of circuit 600 during operation of the ADC 600. As shown in the timing diagram, the switches 609a-e are closed during distinct sampling time intervals of the sampling phase in order to store, on capacitors 603a-e, different samples of the input signal $V_{in}$. Switch 607 remains closed throughout the sampling phase. In the example, the switches 609a-e are operative to connect to the input node $V_{in}$, during each sampling time interval, one or more capacitors such that the sum of capacitance values of capacitors connected during each time interval is the same. In particular, during a first time interval, switch 609a1 is closed to connect a first capacitor 603a1 having a capacitance value of 4C to the input node. During second and third time intervals, switches 609a2 and 609b are respectively closed to connect second and third capacitors 603a2 and 603b, each having the same capacitance value 4C as the first capacitor, to the input node. During a fourth time interval, switches 609c, 609d, and 609e are closed to connect fourth, fifth, and sixth capacitors 603c, 603d, and 603e having a sum of capacitance values of 4C to the input node. As a result, the input voltage signal at $V_{in}$ is sampled at four different time instants t1-t4 during the sampling phase, and the same capacitive load is applied to the input voltage node during each sampling phase.

At the end of the sampling phase, each capacitor 603a-e stores a sample of the input signal $V_{in}$. Specifically, each capacitor 603a-e stores an amount of charge determined based on the value of the input signal $V_{in}$ at the corresponding sample time. The capacitors can, optionally, be coupled in parallel following the sampling phase in order to cause charge stored on each of the capacitors during the sampling phase to be combined and averaged between the capacitors, such that each capacitor stores a same amount of charge. For example, the capacitors 603a-e can be coupled in parallel by opening switch 607, and coupling each of switches 609a-e to ground. However, the coupling of the capacitors in parallel is not required, and charge is combined between the various capacitors 603a-e during the conversion phase.

During the conversion phase, operation of the switches 609a-e as shown in FIG. 6B proceeds similarly to operation of switches 409a-e of FIGS. 4A-4D (with switches 609a1 and 609a2 both behaving similarly to switch 409a). Reference can therefore be made to the description of FIGS. 4A-4D for more detail. The conversion phase is distinct from the sampling phase, and generally each sampling phase is immediately followed by a conversion phase.

In the ADC 600 of FIG. 6A, the capacitors 603a-e are configured for anti-aliasing sampling according to an FIR filter response having coefficients of [1, 1, 1, 1]. Specifically, the FIR filter response has coefficients [1, 1, 1, 1] because the input signal is sampled using a same capacitance load at each of the sampling times t1-t4. As detailed above, the 8C capacitor (see, e.g., capacitor 403a) is electrically broken up into two 4C capacitors (capacitors 603a1 and 603a2). During the sampling operations, $\phi_{609a}1$ and $\phi_{609a}2$ respectively cause each of the two 4C subsections 603a1 and 603a2 of the 8C capacitor to sample the input signal $V_{in}$ during separate sampling time intervals. Subsequently, $\phi_{609b}$ causes the 4C capacitor 603b to sample the input signal $V_{in}$ during its own sampling time interval. Finally, the last sampling time interval period is used to sample the input voltage $V_{in}$ on the 2C (603c), 1C (603d), and dummy capacitor (603e), the sum of which has a total capacitance of 4C.

In some embodiments, after the sampling has been performed the capacitors are first connected in parallel to combine and redistribute charge amongst them prior to the conversion phase. The capacitors may be connected in parallel to allow the sampled charge on each capacitor to combine and redistribute such that each capacitor 603a-e stores the same voltage across it (or stores the same amount of charge) by connecting together the bottom plate nodes (the nodes of the capacitors that are not shared); by connecting the bottom plate nodes to a reference voltage; by connecting together the bottom plate nodes to ground; or by connecting together the bottom plate nodes to any other appropriate voltage.

The connectivity of the capacitors is then adjusted for the conversion phase, so as to create sets of capacitors appropriate for successive approximation (SA) ADC conversion. In particular, during the conversion phase, the two 4C capacitors 603a1 and 603a2 are configured in parallel, and the 2C (603c) and 1C (603d) capacitors are configured to switch independently of each other. The adjustments to the connectivity of the capacitors causes samples stored on the capacitors (e.g., samples of the input voltage amplitude, stored as voltages across the capacitors and as charge on the capacitors) to combine when the capacitors are coupled together in parallel. The ADC conversion can then be performed according to successive approximation ADC conversion techniques as described in relation to FIGS. 4A-4D. In general, during the conversion phase, the connectivity of the capacitors is adjusted so as to provide sets of binary weighted capacitors (i.e., to provide sets of capacitors such that a capacitance of one set $C_{set1}$ is equal to double the capacitance of a next set of capacitors $C_{set2}$: $C_{set1}=2*C_{set2}$; $C_{set2}=2*C_{set3}$; ...). As shown in FIG. 6B, during the conversion phase, capacitors 603a1 and 603a2 form a first set (as evidenced by the fact that switches 609a1 and 609a2 have identical control signals $\phi_{609a}1$ and $\phi_{609a}2$ during the conversion phase) having a total capacitance of 8C; capacitor 603b forms a second set having a total capacitance of 4C; capacitor 603c forms a third set having a total capacitance of 2C; and capacitor 603d forms a fourth set having a total capacitance of 1C.

The capacitors 603a-e used in the SA-ADC can be adjustably connected in order to create different capacitor configurations for use during the sampling and conversion phases. As described in relation to FIGS. 6A and 6B, for example, the capacitors 603a1 and 603a2 may be two separate capacitors during the sampling phase, and may be connected in parallel during the conversion phase in order to function as a single capacitor having a higher capacitance. Similarly, capacitors 603c-e may be connected in parallel during the sampling phase, and may function as separate capacitors during the conversion phase.

Each one of capacitors 603a-e can also be formed of two or more sub-capacitors, or the capacitors 603a-e can be formed of one or combinations of multiple unit capacitors in a capacitor array. FIGS. 7A and 7B describe in detail one example in which capacitors 603a-e are formed of capacitors in a capacitor array 700.

FIG. 7A illustrates an embodiment of a capacitor layout (e.g., comprising unit capacitors, or sub-capacitors) for a 4-bit SA-ADC during a sampling phase. In various embodiments the capacitors comprise a MIMCAP, a MOMCAP, a MOSCAP, a PIP (poly-insulator-poly) cap, or any other appropriate capacitor. Each of the four equal-sized sampling capacitors are configured using switches that connect the unit capacitors in the configuration (or set of capacitors) shown. Capacitors $C_A$ are electrically connected in parallel to form capacitor 603a1 and store a first input voltage sample during the first sampling time interval; capacitors $C_B$ are electrically connected in parallel to form capacitor 603a2 and store a second input voltage sample during the second sampling time interval; capacitors $C_C$ are electrically connected in parallel to form capacitor 603b and store a third input voltage sample during the third sampling time interval; and capacitors $C_D$ are electrically connected in parallel to form capacitors 603c-e and store a fourth input voltage sample during the fourth sampling time interval.

During the conversion phase, the connectivity of the capacitors in the array 700 is adjusted to different configurations as shown in FIG. 7B. In particular, as shown in FIG. 7B, the capacitors are reconfigured in a binary weighted fashion suitable for a successive-approximation operation using charge redistribution. Capacitors labeled $C_8$ represent a first set of unit capacitors connected in parallel that form the 8C capacitor in the SAR cap array; capacitors labeled $C_4$ represent a second set of unit capacitors connected in parallel that form the 4C capacitor (capacitor 603b) in the SAR cap array; capacitors labeled $C_2$ represent a third set of unit capacitors connected in parallel that form the 2C capacitor (capacitor 603c) in the SAR cap array; and capacitors labeled $C_1$ and $C_D$ respectively represent a fourth and a dummy set of unit capacitors forming the 1C capacitor (capacitor 603d) and dummy capacitor (capacitor 603e) in the SAR cap array. The adjustments to the connectivity of the capacitors between the sampling and conversion phases cause samples stored on the various capacitors in each group/configuration (and charge stored on the capacitors) to combine and equalize between capacitors in a same group/configuration.

While the capacitor array examples discussed in relation to FIGS. 7A and 7B show all capacitors being used both in the sampling phase and in the conversion phase, all capacitors in the array need not be used in both phases. In some embodiments, only a portion of the capacitors are used. For example, in an 8-bit ADC comprising 256 unit capacitors, 8 sets of sampling capacitors are used for filtering, each sampling capacitor comprising 16 unit capacitors (for a total of 128 capacitors used for sampling), with the remaining 128 capacitors not being used for sampling, but used during the conversion phase. During the sampling phase, eight sampling intervals (and 8 corresponding sampling times) are used to sample the input signal $V_{in}$ on each of the 8 sets of sampling capacitors. Hence, during the conversion phase, 8 sets of conversion capacitors are used such that a first set is formed of 128 unit capacitors; a second set is formed of 64 unit capacitors; a third set is formed of 32 unit capacitors; a fourth set is formed of 16 unit capacitors; a fifth set is formed of 8 unit capacitors; a sixth set is formed of 4 unit capacitors; a seventh set is formed of 2 unit capacitors; and an eighth set is formed of 1 unit capacitor (and a dummy set is formed of 1 unit capacitor). By sampling the input signal on a subset or a superset of the conversion capacitors, a scale factor greater or less than unity (as compared to the reference voltage) may be attained. For example, the full scale for the 8-bit ADC where only half the capacitance is used for sampling would be double the value were all the capacitors sampled. This may be useful in cases where a full scale greater than the reference voltage is desired.

In some embodiments at least some capacitors that are used for sampling the input signal are not used during conversion to digitize the input signal (e.g., the additional sampling capacitors are used to sample and filter the input signal, but are not controlled as part of the SA-DAC during the conversion portion of the cycle). Although the sampling capacitors are not used as part of the SA-DAC during the conversion phase, the charge stored during the sampling of these capacitors is combined with and averaged among the various sampling capacitors (including sampling capacitors used during the conversion phase) and provides charge upon which the SA-DAC operates during the conversion portion of the cycle. Configuration in this manner may result in a reduced ADC output full scale.

Figure 6C:
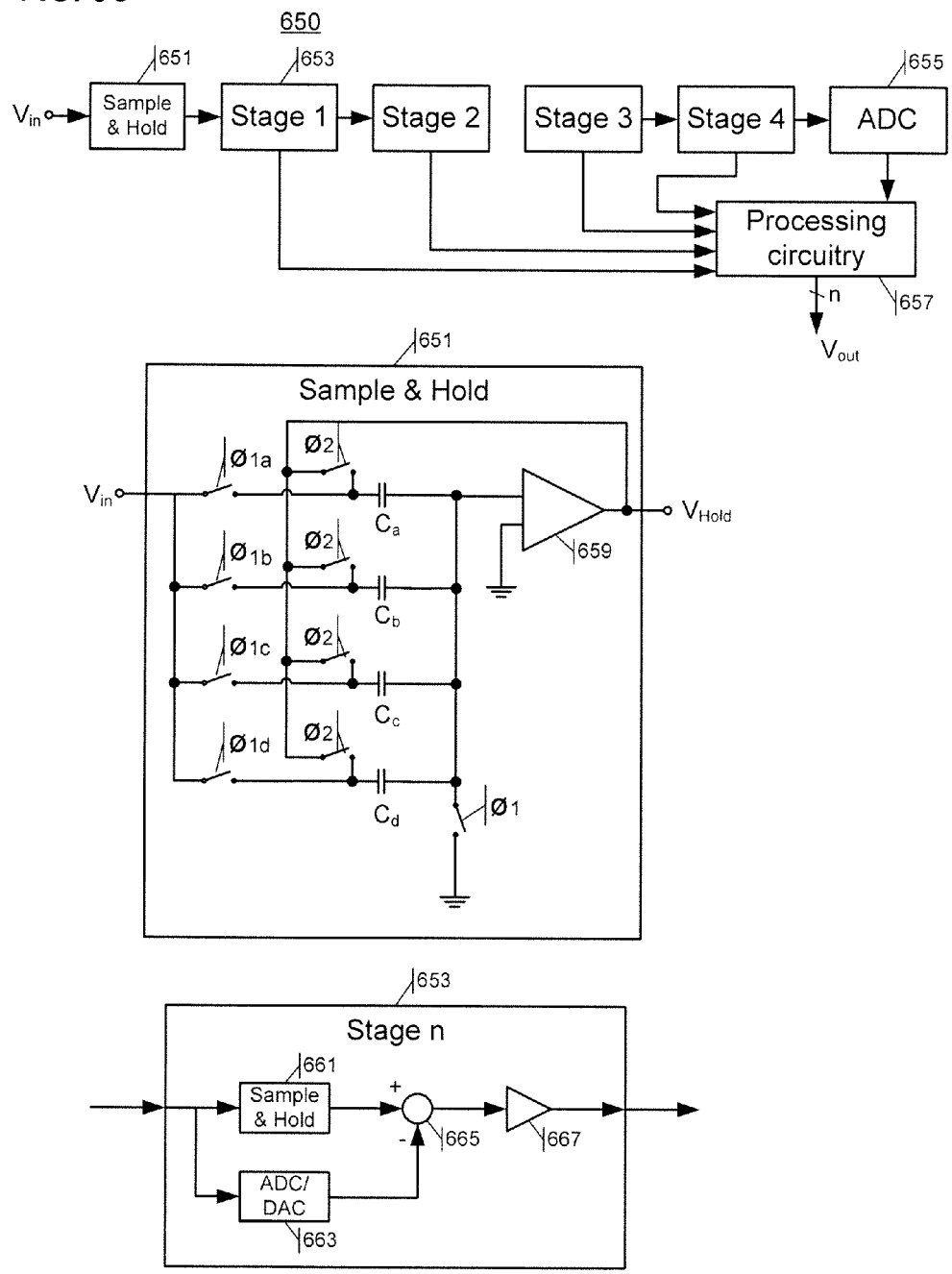
FIG. 6C shows an illustrative pipelined ADC circuit having a set of capacitors used to sequentially sample an input signal.

The sampling circuit 500 can be applied to other types of sampling circuitry, such as to a sample-and-hold circuit of a pipelined ADC. FIG. 6C shows an illustrative pipelined ADC 650 for converting an analog input signal $V_{in}$ into a n-bit digital output signal $V_{out}$. The pipelined ADC circuit 650 includes an input sample-and-hold circuit 651 for taking successive samples of the input signal $V_{in}$ and providing the samples to a series interconnection of one or more conversion stages 653 (illustratively shown as stages 1-4 in FIG. 6C) and an ADC stage 655. Each of the stages 653 and the ADC stage 655 provide several bits of information to processing circuitry 657 which produces the digital output signal $V_{out}$.

The pipelined ADC 650 includes an anti-aliasing sampling circuit as part of the sample-and-hold circuit 651, as shown in the central part of FIG. 6C. As shown, the sample-and-hold circuit 651 includes a plurality of sampling capacitors $C_a$-$C_d$ each having two associated switches. During a sampling phase, distinct samples of the input signal $V_{in}$ are stored on each of the sampling capacitors by sequentially closing the switches $ø_{1a-d}$ while switch $ø_1$ is closed. Each switch $ø_{1a-d}$ connects a node of a corresponding sampling capacitor to the input voltage node $V_{in}$, while switch $ø_1$ connects the other node of the capacitor to a common voltage (e.g., a ground voltage). Switches $ø_2$ are open during the sampling phase. Upon completion of the sampling phase, the sample-and-hold circuit 651 transitions to a hold phase of operation. During the hold phase, switches $ø_{1a-d}$ and $ø_1$ are open, while switches $ø_2$ are closed to connect the sampling capacitors in parallel with each other and combine the samples stored on each of the capacitors. An amplifier 659 provides the output signal $V_{Hold}$ at an output of the sample-and-hold circuit 651 during the hold phase, the amplifier providing an output signal voltage indicative of the combined sample stored on the sampling capacitors. In the example shown, four sampling capacitors are used each having the same capacitance, although different numbers and/or sizes of capacitors may be used in other examples to obtain different anti-aliasing transfer characteristics as described herein.

Each of the stages 653 of the pipelined ADC may have a structure as shown in the lower part of FIG. 6C. As shown, each stage 653 can include its own sample-and-hold circuit 661, a series interconnection 663 of an ADC and a DAC, a summation block 665, and a gain block 667. In general, the sample-and-hold circuit 661 is a standard sample-and-hold circuit which provides at its output a signal equal to the input at the time of sampling. In some examples, however, the sample-and-hold circuit 661 may provide anti-aliasing filtering by, e.g., including a circuit similar to that described above in relation to sample-and-hold circuit 651. The series interconnection 663 of the ADC and DAC provides, at an output of the ADC, a digital output value corresponding to a conversion of the signal at the ADC input. The digital output value produced by the ADC is provided to the processing circuit 657 for use in computing the digital output signal $V_{out}$. The DAC converts the digital output value back to an analog signal value which is subtracted, by summation block 665, from the signal at the output of sample-and-hold circuit 651. The gain block 667 amplifies the signal at the output of the summation block 665, and provides the amplified signal to a next stage 653 or to the ADC 655.

The discussion has focused thus far on sampling circuits having equally sized sampling capacitors—specifically, on sampling circuits in which capacitors having a same total capacitance value are connected to the input voltage node $V_{in}$ during each sampling time interval. For example, in the example discussed in relation to FIGS. 6A and 6B, one or more capacitors having total capacitance values of 4C were described as being connected to the input voltage node $V_{in}$ during each sampling time interval. Hence, four evenly-weighted samples of the input signal were taken, resulting in an anti-aliasing filter having coefficients [1 1 1 1] and a sinc1 filter characteristic: $C*V_{in}+C*V_{in}z^{-2}C*V_{in}z^{-3}$.

In some embodiments, filters having other than a sinc1 characteristic are used. Non-equal tap weighting may be realized by configuring the sampling capacitors unequally. For example, a filter with the following coefficients [1 3 3 1] may be realized using a 4-bit SA ADC by configuring the capacitors to sample the input signal with total capacitance values of $2*C$, $6*C$, $6*C$, $2*C$, so as to obtain a filter-characteristic (charge) of $2*C*V_{in}+6*C*V_{in}z^{-1}+6*C*V_{in}z^{-2}+2*C*V_{in}z^{-3}$, which is equivalent to a filter characteristic of $C*V_{in}+3*C*V_{in}z^{-1}+3*C*V_{in}z^{-2}+C*V_{in}z^{-3}$ with a scale factor of 2. Specifically, in order to implement an anti-aliasing filter having coefficients [1 3 3 1] using adjustable sampling capacitors, a first set of capacitors having total (summed) capacitance of 2C would be coupled to the input node $V_{in}$ during a first sampling time interval, while second and third sets of capacitors each having total (summed) capacitance values of 6C would be coupled to the input node $V_{in}$ during each of the second and third sampling time intervals, and a fourth set of capacitors having a total (summed) capacitance value of 2C would be coupled during the fourth sampling time interval. The conversion phase would then be implemented as described in relation to FIGS. 6A and 6B with binary weighted sets of capacitors.

In some embodiments, a negative filter coefficient is implemented using a differential capacitor array wherein the polarity of the voltage across the capacitor is flipped for negative coefficient taps by adjusting the connectivity of the capacitor such that the positive input signal terminal is connected to the negative capacitor input terminal and the negative input signal terminal is connected to the positive capacitor input terminal. In some embodiments, a negative coefficient is realized by connecting the sampling capacitor to an inverted value (generated using an amplifier, or switch-cap techniques) of the input signal. In some embodiments, a coefficient equal to zero is realized by not sampling the input signal or sampling ground or any other appropriate voltage.

In some embodiments, dynamics may be used to implement a more complicated filter. For example, after each input sample, an intermediate phase configures the sampled inputs such that the capacitors are in parallel, the voltage at the common node (connected to the comparator) being used to generate subsequent input samples through feedback to the input signal.

In some embodiments, non-integer related capacitor ratios are used. For example, in some embodiments, the DAC capacitors for the SA ADC are non-binary weighted (e.g., to improve a differential non-linearity (DNL) characteristic). In some embodiments, non-integer related filter taps (e.g. capacitor ratios) are generated using a dedicated set of sampling capacitors that are not used in the conversion process; the capacitors do share a common node with the conversion capacitors so the charge sampled during the sampling operations is operated upon by the second set of capacitors during the conversion phase to result in a digital word.

Figure 8A:
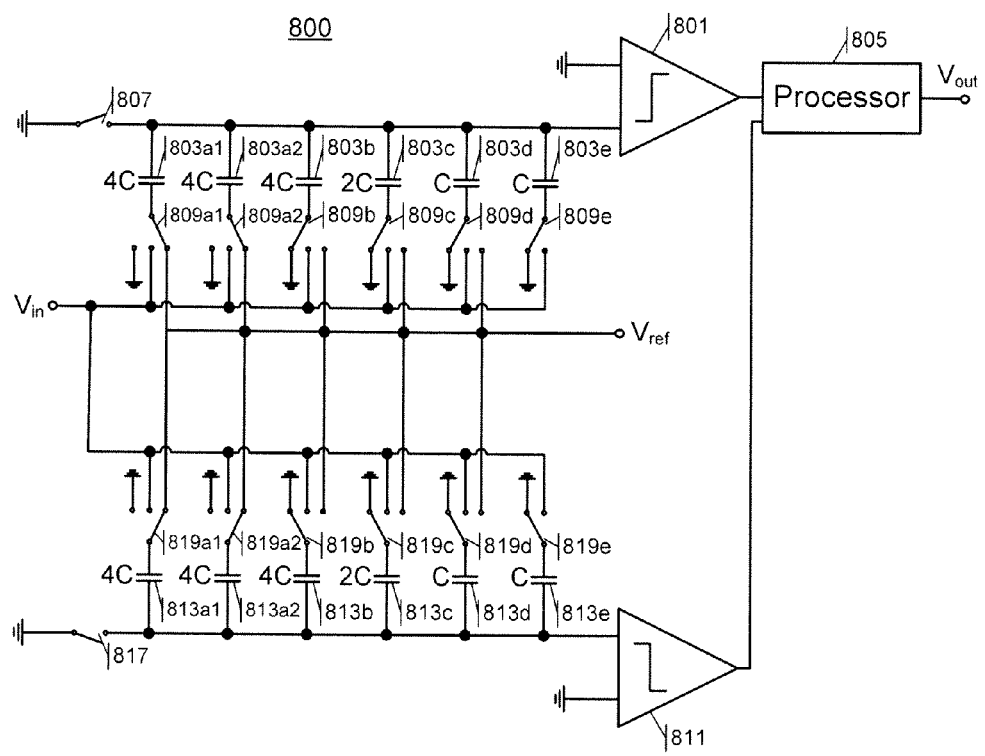
FIG. 8A shows an illustrative SA-ADC circuit having dual capacitor arrays used to sequentially sample an input signal.

In some embodiments, two or more capacitor arrays are used in an ADC. An illustrative 4-bit ADC with dual capacitor arrays 803*a-e* and 813*a-3* is shown in FIG. 8A. By using two capacitor-arrays, additional time for performing the conversion is provided. FIG. 8B shows a timing diagram for operation of the ADC of FIG. 8A. As shown in FIGS. 8A and 8B, a first set of capacitors 803*a-e* is used to sample the input signal $V_{in}$ during a first phase (Phase 1), while a second set of capacitors 813*a-e* is used as part of a conversion operation. During a second phase (Phase 2), the samples stored on the first set of capacitors 803*a-e* are used as part of a conversion operation, while the second set of capacitors 813*a-e* is used to sample the input signal $V_{in}$. Processor 805 controls the operation of switches 807, 809*a-e*, 817, and 819*a-e* according to control signals $\emptyset_{807}$, $\emptyset_{809a-e}$, $\emptyset_{817}$, and $\emptyset_{819a-e}$. In some embodiments, two capacitor arrays sample the inputs in sequence (e.g. the first array samples when the second array is converting and vice versa), as shown in FIGS. 8A and 8B. In some embodiments, at least a portion of the sampling operations of both arrays are overlapped in time. Additionally, while the ADC 800 is shown as having two separate comparators 801 and 811, a single comparator can be shared as part of a dual-capacitor-array ADC.

In some embodiments, a voltage buffer is used to condition the signal before sampling.

In some embodiments, the smaller conversion frequency for a required anti-aliasing performance provides for lower power consumption since the input to the converter doesn't have to charge a large capacitance at once. In some embodiments, the smaller conversion frequency for a required anti-aliasing performance provides for lower power consumption since the converter (including the comparator) may convert at a reduced rate for a constant anti-aliasing performance.

In various embodiments, the filter coefficients are able to be set by a user by adjusting the connectivity of capacitors during the sampling and conversion phases. For example, a user may controllably select, for each sampling time interval in the sampling phase, a different set of capacitors to be connected together and used to sample the input signal. The user may further controllably select, for use during the conversion phase, different sets of capacitors to be connected together and used for conversion into bits of the digital output signal. In general, the sets of capacitors connected together during the conversion phase are selected to be binary weighted, such that a first set of capacitors used in the conversion time interval (e.g., a set of capacitors used to form capacitors 603*a*1 and 603*a*2) has twice the total capacitance of a second set of capacitors used in the conversion time interval (e.g., a set of capacitors used to form capacitor 603*b*), the second set has twice the capacitance of a third set of capacitors (e.g., a set of capacitors used to form capacitor 603*c*), etc. The adjustment of the connectivity of capacitors by a user may be accomplished through shifting in desired coefficients to a digital logic block that oversees capacitor switching; and/or a user may select from a list of filters and decimation ratios that a digital logic block support. In some embodiments, an anti-aliasing filter with a zero in a desired place to remove a signal at a known frequency may be constructed.

In one example, a filter can be constructed from the convolution of an 8-tap sinc1 filter with a 5 tap FIR filter having coefficients [4 2 1 2 4]. The coefficients of the convolved filter are: [4, 6, 7, 9, 13, 13, 13, 13, 9, 7, 6, 4]. The convolution of the two filters provides additional nulls at frequencies defined by the choice of FIR coefficients (as compared with the sinc1 filter alone). The sum of the coefficients is 104 which allows each coefficient in the above array to correspond to two unit capacitors times the coefficient value in an 8-bit ADC with dual capacitor arrays. Thus, 208 capacitors out of the 256 capacitors are used for sampling and used during the conversion phase, while the remaining 48 capacitors are used in the conversion phase but not used for sampling. Note that to realize the maximum anti-aliasing performance of the sinc1 filter near DC, the ADC should be decimated by a factor of 8 (corresponding to eight distinct sampling time intervals during the sampling phase). However, the FIR has 12 taps. Thus, the sampling of the first capacitor array and the second capacitor array overlap in time, sampling the same voltages (albeit on possibly differently sized sampling capacitors) for some samples. Overlapping of sampling operations reduces the amount of time allotted for conversion when two capacitor arrays are used. A third capacitor array may be used to recover time to further relax demands on the comparator. For this embodiment, the scale factor will differ from an ADC and may be compensated by adjusting the reference voltage, or digitally compensating for the known scale factor. In some embodiments, changes in scale factor, consistent with the above example, is not a material performance metric.

Figure 9:
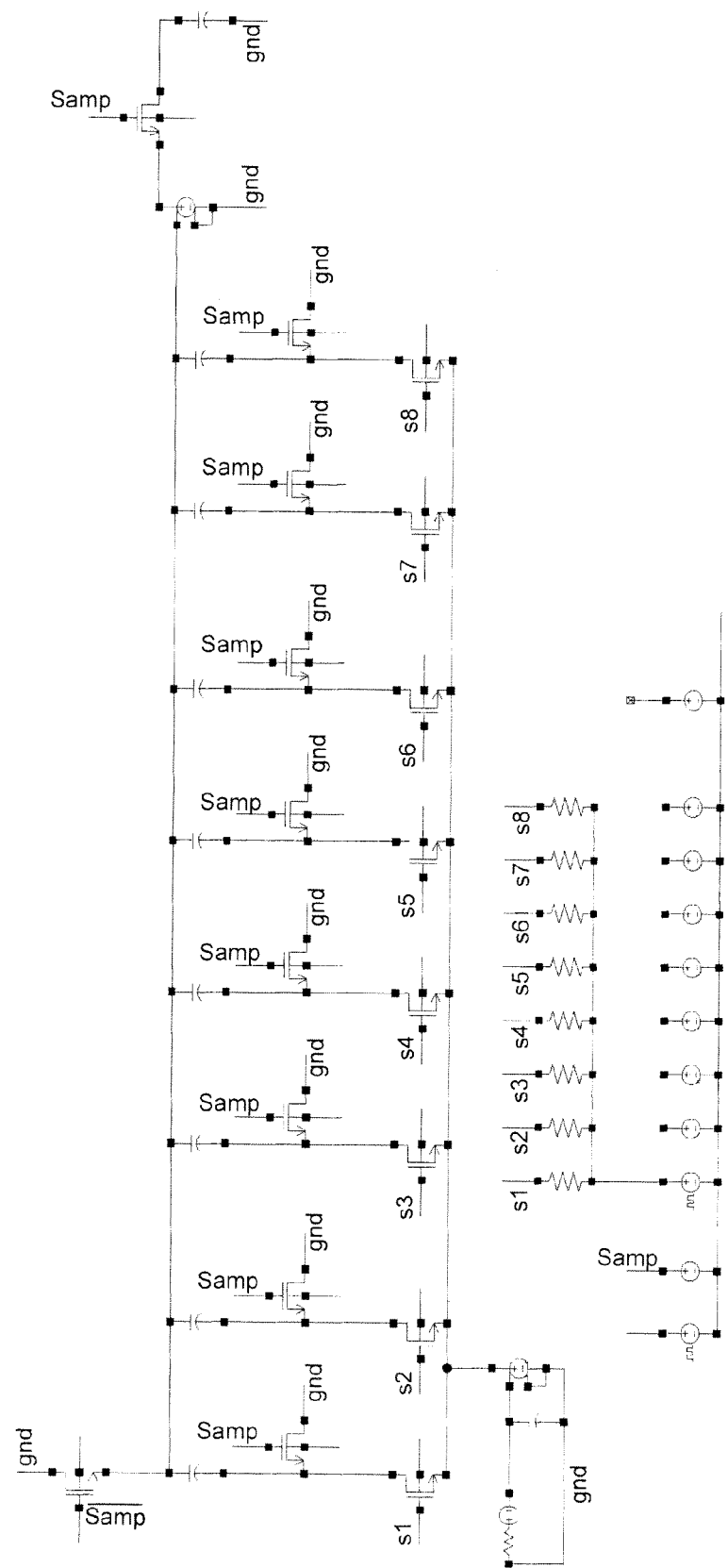
FIG. 9 shows a circuit schematic of a SA-ADC circuit implementing an 8-tap sinc anti-aliasing filter.
Figure 10:
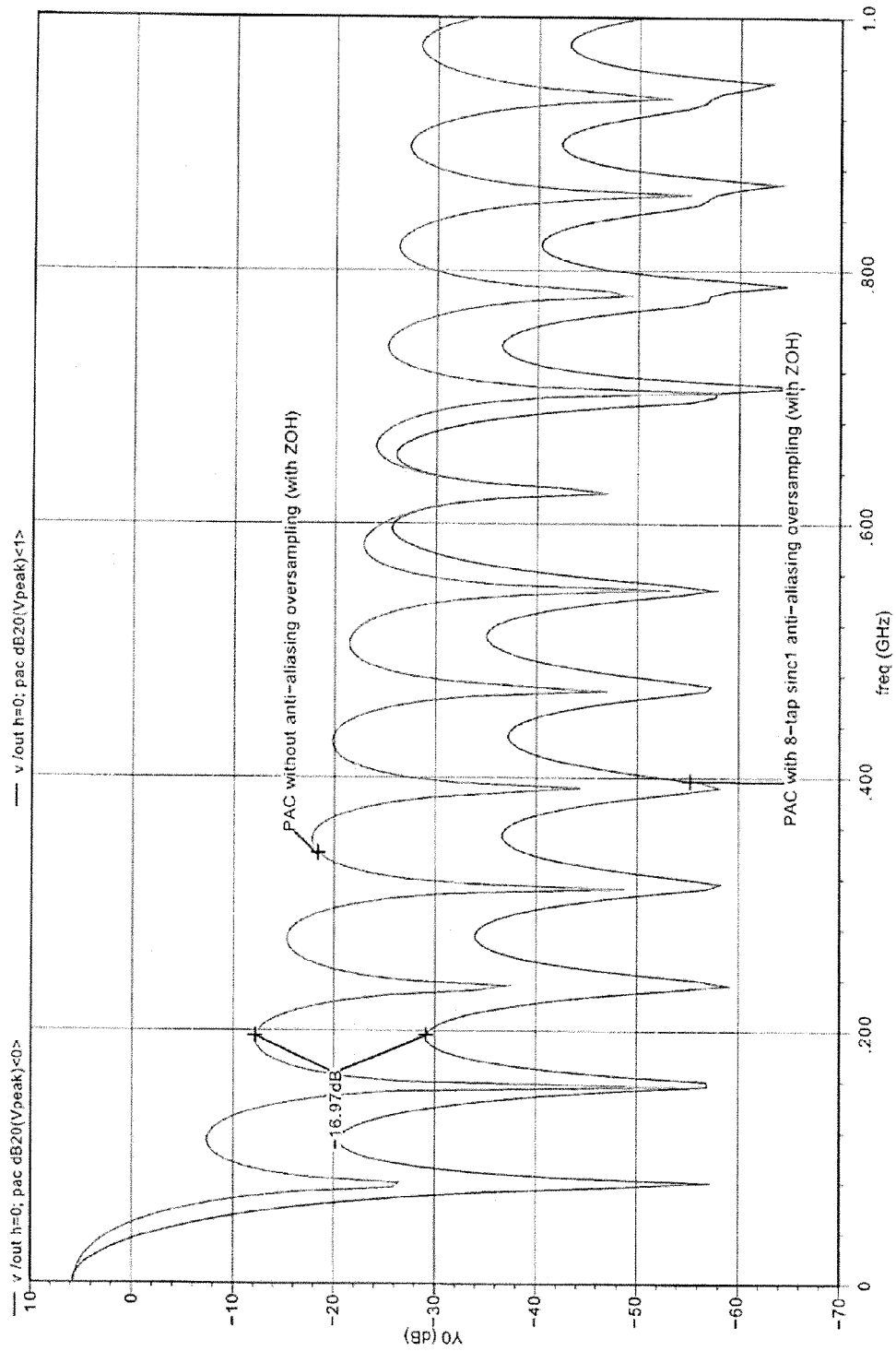
FIGS. 10 and 11 show plots of performance measurements of signal sampling methods and conversion methods implemented by the circuit of FIG. 9.
Figure 11:
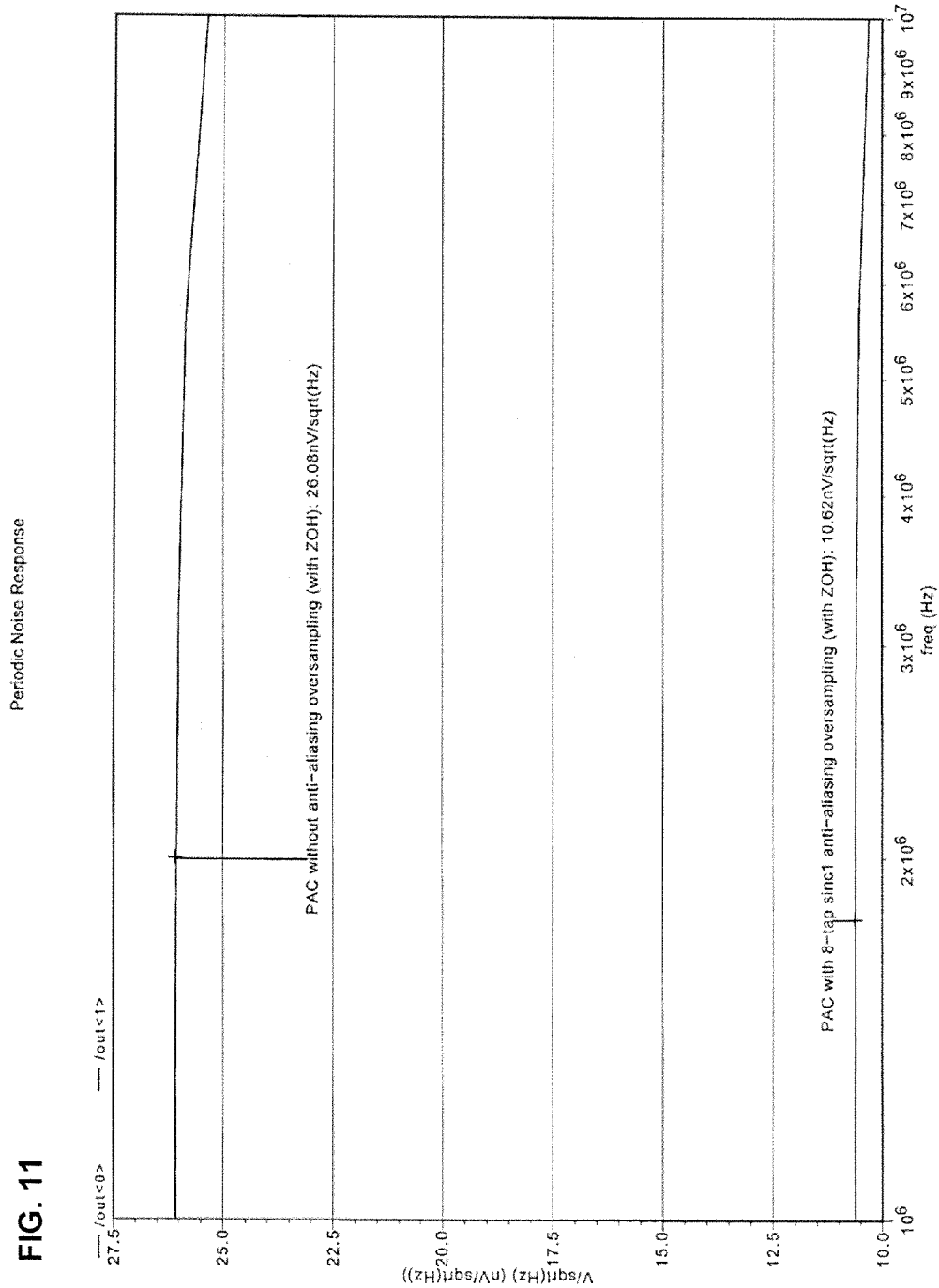

FIGS. 9-11 show an illustrative example of the performance benefit of the signal sampling methods and conversion methods as described herein. FIG. 9 is a schematic of a circuit used to simulate the performance of an 8-tap sinc1 anti-aliasing filter with an effective sampling frequency of 625 MHz (corresponding to an interval between subsequent sample times of $T_{se}=1/(625\times10^6)$ s) and a "conversion" frequency of $1/8^{th}$ this value, or 78.125 MHz. In this circuit, the ADC conversion step is emulated by sampling the output voltage at the time conversion would be started. FIG. 10 illustrates the periodic AC response with and without oversampling onto the capacitor array. Note that the simulator (SpectreRF) applies a zero-order hold to the output signal causing the frequency response to appear to have a sinc function, as opposed to a true discrete time sampling operation. As can be seen from the plot there is a 17 dB drop in frequency response out-of-band thereby reducing the effect of noise folding and aliasing. FIG. 11 illustrates the improved output noise with anti-aliasing: the noise floor at the output with anti-aliasing is 10.6 nV/rtHz, versus 26.1 nV/rtHz without oversampling and with all other things held constant (all 8 caps sampled at the same time vs. sequential sampling). The improvement of 2.5× is consistent with what would be expected from decimation with vs. without an anti-aliasing filter, because when decimating by a factor of 8 (without a filter), the noise power should increase by a factor of 8, yielding a sqrt(8)=2.8× increase in RMS noise density. Different filters and decimation ratios may yield even more out of band rejection and improved noise performance.

Frequency response fidelity is principally set by matching of capacitors; matching is generally very good for capacitors used in ADCs. Furthermore, the dynamic range of the anti-aliasing filter may be greater than the dynamic range of the ADC itself—as long as the switches are able to sample the input signal signals (e.g. boosted switches or complementary switches that allow for operation beyond the ADC limits without forward-biasing diodes) that lie in a null will be removed before being operated upon by the ADC.

In some embodiments, the anti-aliasing filter extends into the sample bandwidth (e.g., if the ADC outputs digital words at a 10 MHz rate the filter response may extend into the 5 MHz bandwidth which is covered by the 10 MHz sample rate according to Nyquist).

In some embodiments, an anti-aliasing ADC is incorporated into a radio receiver to digitize a received signal in a desired bandwidth of interest (e.g. baseband) while rejecting out of band noise and interferer signals. In some embodiments, an anti-aliasing ADC is used as a stand-alone ADC for customer applications which require an anti-aliasing filter and/or in-band filtering. In some embodiments, a stand-alone ADC uses an input clock to synthesize a higher frequency clock used to sample the input capacitors consistent with the teachings herein. In some embodiments, a stand-alone ADC allows a user to enter or select filter coefficients, decimation ratio, or scale factor. In an exemplary embodiment a 12-bit SA-ADC receives a 1 MHz sample clock and outputs data at a 1 MHz sample rate, the 1 MHz sample clock is used to synthesize a 64 MHz clock used for sampling the ADC input capacitors which are configured during sampling mode to sample 64 unit capacitors at a 64 MHz sample rate thereby implementing a 64-tap sinc1 filter.

Figure 12A:
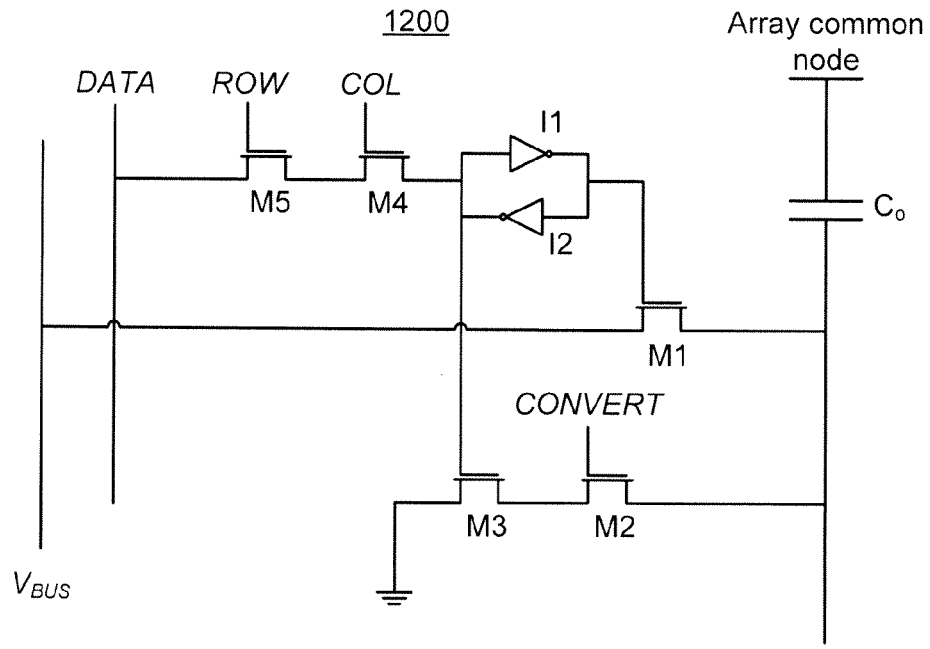
FIG. 12A shows illustrative cell selection circuitry for adjustably connecting capacitors in a capacitor array.

FIG. 12A illustrates a cell-selector and multiplexer (CSM) circuit 1200. The CSM 1200 may be used to dynamically adjust and multiplex the connectivity of unit capacitor cells within a SA-ADC. In an exemplary embodiment, a 4-bit ADC has a 4×4 array of unit capacitors (as illustratively shown in FIG. 12B), and samples the input in a fashion to implement a 16-tap sinc1 filter. The circuit of FIG. 12A lies beneath each unit capacitor (or, in some embodiments, a cluster of capacitors connected in parallel) and allows capacitors to be selected by an address (ROW and column (COL) signal lines) in conjunction with two control signals which are shared amongst multiple cells: DATA and CONVERT.

At the beginning of a sampling period, all the unit capacitors are disconnected from $V_{BUS}$ which is connected to the input terminal $V_{in}$ at this point. This is accomplished by setting all 4 row and all 4 column selection bits high, and driving shared signal DATA high (this disconnects NMOS switch M1 from $V_{BUS}$ by causing inverter I1 to output a logic low signal to switch M1). Simultaneously, CONVERT is set low to disconnect NMOS switch M2 from ground regardless of the state of the switch M3. Next, sampling commences. The first sample point occurs on the top left capacitor (identified in FIG. 12B with a bold X) and is accomplished by driving ROW,COL=0001,0001 (which selects the upper left hand cap, see FIG. 12B) while applying a 0 to DATA to maintain the DATA line un-activated (note that two capacitors could be selected by driving two row or two column signals high, etc.). At this point, M1 is closed and samples the voltage applied to $V_{BUS}$ onto the capacitor. DATA is then set high completing the sampling operation and then the ROW and COL signals are switched to select the next capacitor to sample. After the $16^{th}$ capacitor has been sampled, the bottom plates of all the capacitor arrays are floating and the array is ready for conversion.

At the beginning of conversion, a reference voltage is applied to $V_{BUS}$ and CONVERT goes high. At this point, all unit capacitors are either pulled to reference or ground depending on the internal state of the latch formed of dual inverters I1 and I2. In some embodiments, a latch isn't used but a capacitor is used to store state for the required period during conversion. During conversion, ROW and COL selection signals are chosen to select 8 unit capacitors for the most significant bit (MSB) conversion and a reference voltage is applied to $V_{BUS}$. By toggling the DATA line, the connectivity of the selected capacitors may be toggled between the reference voltage and ground; SA-A/D conversion continues according to the description previously provided of FIGS. 4A-4D and 6A-6B.

Figure 12B:
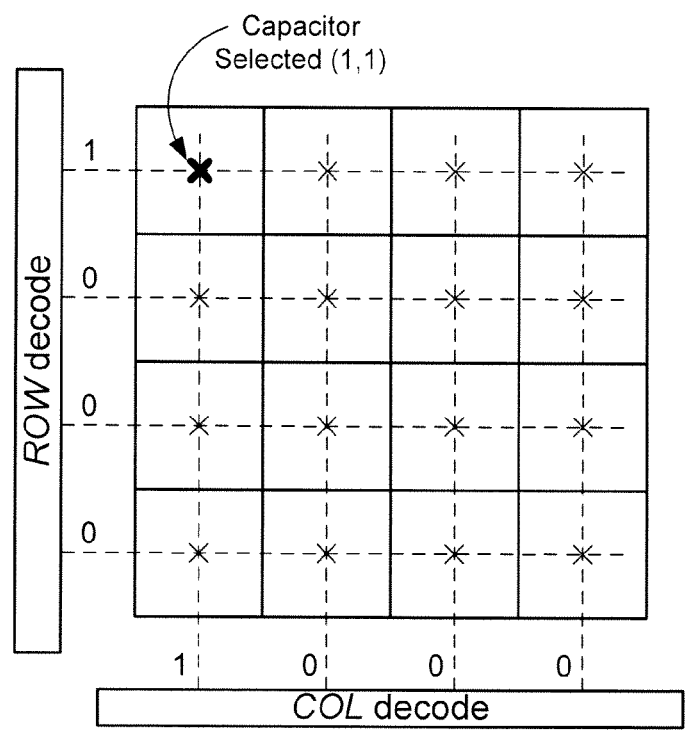
FIGS. 12B and 12C show illustrative capacitor arrays including the cell selection circuitry of FIG. 12A.
Figure 12C:
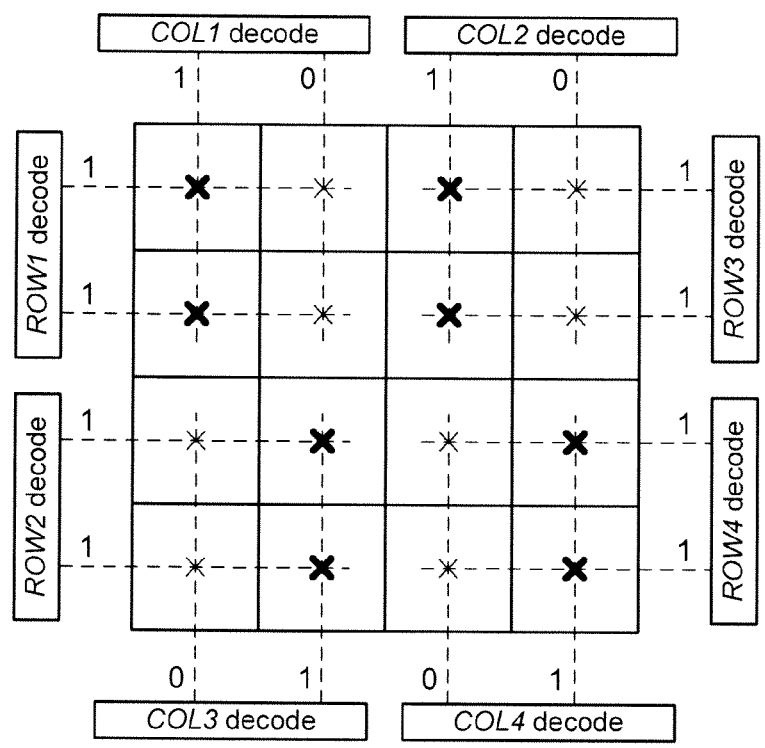

In some embodiments, a plurality of row and column address lines or additional selection signals are used to allow dynamic switching of the unit capacitors in a common-centroid fashion during the conversion process. FIG. 12C shows a 4×4 array comprising 4 pairs of 2×2 ROW×COLumn address lines configured to select 8 capacitors in a common-centroid fashion during the conversion process. Common-centroid selection of the capacitors generally provides improved matching performance and hence better differential non-linearity (DNL) characteristic than non-common-centroid selection of unit capacitors. Note that to control every bit of a 10-bit ADC independently and allow common centroid selection, only 4*(16+16)=128 row+column lines are required (as opposed to 32+32=64 for the structure as shown in FIG. 12B).

Figure 13A:
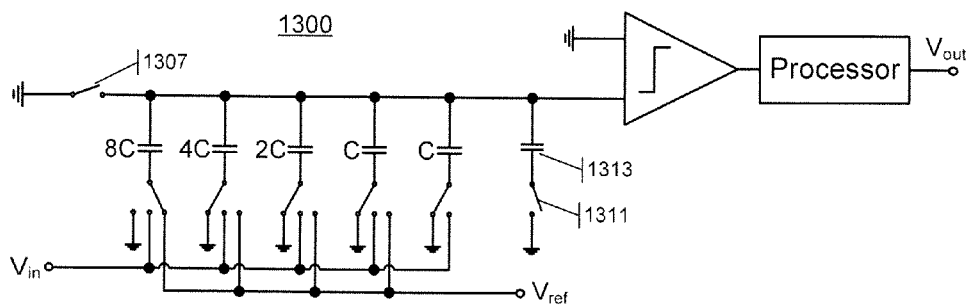
FIG. 13A shows an illustrative SA-ADC circuit having a capacitor used to implement infinite impulse response (IIR) filter characteristics.
Figure 13B:
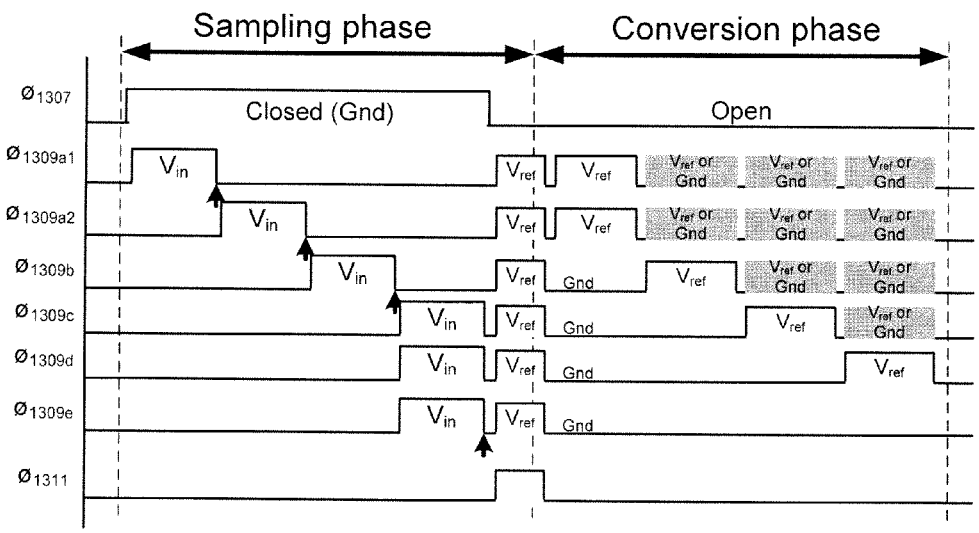
FIG. 13B shows an illustrative timing diagram of control signals used for operating the SA-ADC of FIG. 13A.

In some embodiments, an infinite impulse response (IIR) anti-aliasing filter response is constructed passively as shown in FIGS. 13A and 13B. In some embodiments, an IIR response is constructed by connecting an IIR capacitor 1313 of a SA-ADC 1300 to the common array node after sampling has completed but before conversion is initiated, by closing switch 1311, as shown at $\emptyset_{1311}$ in FIG. 13B. While the IIR capacitor 1313 is connected to the array node, the sampling capacitors are all connected to ground (or all connected to $V_{ref}$), and switch 1307 is open. The IIR capacitor 1313 shares its charge (sampled from the last period) and samples the filtered voltage at the common array node, corresponding to the average voltage stored on the sampling capacitors. Next, IIR capacitor 1313 is disconnected by opening switch 1311, thereby storing a charge from the last sample for addition (or subtraction) to the next sample. The IIR capacitor 1313 then stores an average of the samples previously stored on the sampling capacitors during the previous sampling time interval, which can be used during a future conversion phase. Specifically, during a future conversion phase, the connectivity of the capacitors is adjusted (by selectively closing switch 1311 and the switches associated with each of the sampling capacitors) in order to combine the charge stored on capacitor 1313 and on the sampling capacitors. The re-configuring of the capacitors is performed such that capacitance ratios between the capacitors correspond to ratios between tap coefficients of a desired IIR filter response.

The size of the passive IIR capacitor 1313 relative to the other capacitor array capacitance sets the discrete time pole of this system. In some embodiments, a buffer or an amplifier coupled to the common node is used to apply charge to the IIR capacitor 1313. Buffering or amplifying the common node signal when it is sampled (as opposed to direct connection) may be used to adjust the dynamics of the IIR filter over a range of values greater than possible using passive sampling.

Figure 14:
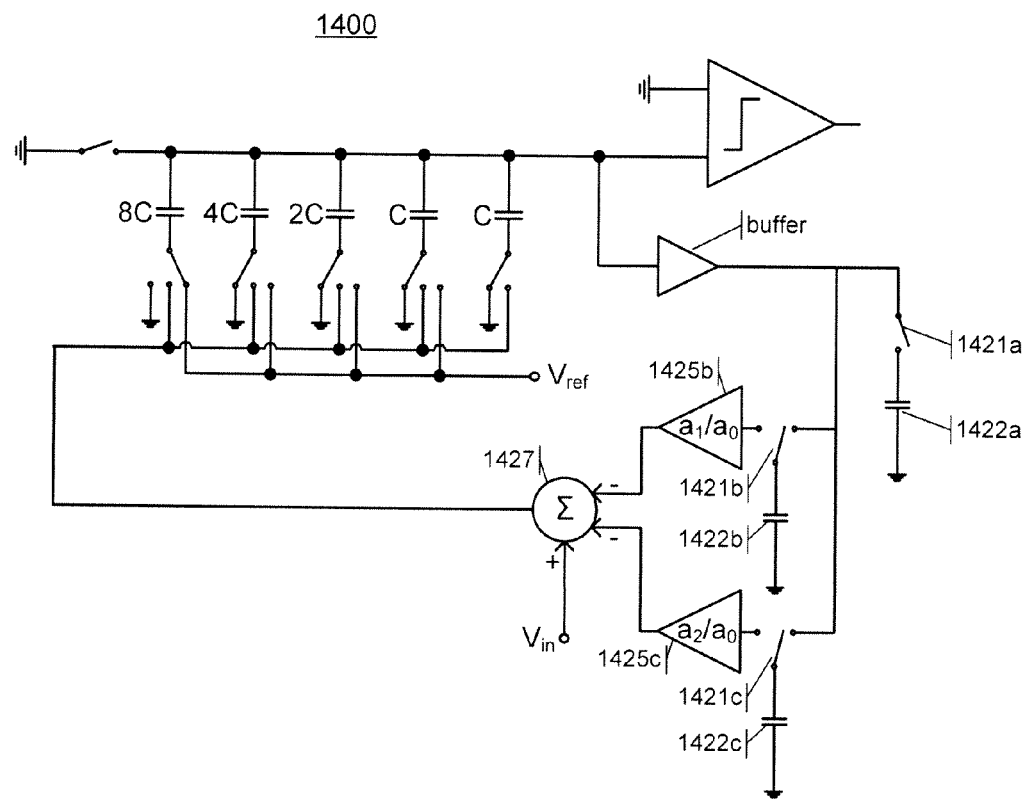
FIG. 14 shows an illustrative SA-ADC circuit having multiple capacitors used to implement IIR filter characteristics.

In some embodiments, poles and/or zeros are placed in an arbitrary fashion to attain a desired frequency response characteristic. FIG. 14 shows an illustrative SA-ADC 1400 including a second-order discrete time IIR-filter having a transfer function:

$$H(z) = \frac{b0 + b1*z^{-1} + b2*z^{-2} + b3*z^{-3}}{a0 + a1*z^{-1} + a2*z^{-2}}.$$

This transfer function may implement a filter characteristic such as a Butterworth, Chebyshev, Elliptic, or any other characteristic. The filter choice and design determines the appropriate values of the coefficients a0, a1, a2, b0, b1, b2, and b3. A summer block 1427 subtracts feedback values at the output of amplifiers 1425*b* and 1425*c* from the input signal $V_{in}$. The feedback values are based on sampled values stored on capacitors 1422*b* and 1422*c*, which respectively correspond to the last two saved states from operation of the circuit. The feedback values are used as inputs to the summer block 1427 at the end of conversion phase, by coupling capacitors 1422*b* and 1422*c* to the summer block using switches 1421*b* and 1421*c* while the array switches are in a configuration to ensure the summed charge is sampled (for example, all array caps are connected to ground). Three capacitors 1422*a-c* are utilized and electrically "passed around a loop" in a round robin fashion using switches 1421*a-c*. After sampling, the capacitor 1422*b* is connected to a first gain block 1425*b* that scales the voltage by a1/a0. After the next conversion cycle, the value stored on capacitor 1422*b* is passed to capacitor 1422*c* which itself can be connected to a second gain block 1425*c* that scales the voltage by a2/a0. Alternatively, the capacitor 1422*b* can be coupled directly to the second gain block 1425*c*, so as to obviate the step of passing stored values between capacitors 1422*a-c*. The output of the gain blocks 1425*b* and 1425*c* are summed with the input signal at 1427, to be digitized and applied to the sampling capacitors as described above. The coefficients b0-b3 are determined, as in the example of circuit 500, based on the ratio of capacitance values of capacitors used for sampling during each sampling time interval.

In some embodiments, an active filter using continuous time (CT) or discrete time (DT) techniques are utilized to implement an IIR or FIR filter.

In some embodiments, the full scale range of an ADC is adjusted to center the dynamic range of the ADC to an input signal thereby maximizing the number of useful bits in the ADC. In one embodiment, a ratiometric ADC samples a plurality of ratiometric sensors, each sensor having a different scale factor or full scale output voltage. In another embodiment, an ADC full-scale range is adjusted to maximize dynamic range for an input signal given a reference voltage that may not be optimal for the ADC converter but is otherwise available. In some embodiments, the full scale value of the ADC is intentionally adjusted by varying the ratio of the total sampling capacitance to the capacitance of the capacitor array used for conversion. For example, if a gain of 2× is desired and the SA-Cap array is 5 pF, then the sampling capacitance would comprise the 5 pF SA Cap array plus an additional 5 p cap that is used only in the sampling of an input signal. If a gain of 0.5× is desired and the SA-Cap array is 5 pF, then the sampling capacitance would comprise only half of the 5 pF SA Cap array. In some embodiments, filtering and/or decimation are not applied; simply the gain adjustment is used. In some embodiments, a gain adjustment is used to adjust a differential ADC.

In some embodiments, a capacitor divider is used to effect an equivalent capacitance and/or ratio between a sampling capacitor and a SA Cap array. For example, if a gain of 8× is desired, one could use a 35 p sampling capacitor in conjunction with the SA Cap array; however, such a large capacitance may be impractical or undesired. Instead, a 3.5 p sampling capacitor could be used and a 5 p SA-cap array could be used with a capacitive divider in series between the SA array and the sampling capacitor, such that the capacitive divider causes a change in capacitance and/or charge in the SA array to present a charge one-tenth this size to a node in common with the sampling capacitor.

In some embodiments, a CSM is used to adjust the assignment of one or more unit capacitors to improve matching between binary weighted arrays of capacitors. In some embodiments, an auto-calibration procedure is performed wherein comparisons between capacitors or comparisons between collections of capacitors are used to assign unit cells to a collection of capacitors so that the total capacitance of two collections of capacitors is made more equal. In various embodiments, the assignment of unit cells to capacitor collections is based on a random, or a pseudo-random value; the assignment of unit cells to capacitor collections is deterministic.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A circuit comprising:
a first capacitor for sampling an analog input signal at a first time during a sampling time interval;
a second capacitor for sampling the analog input signal at a second time during the sampling time interval, wherein the second time is distinct from the first time; and
circuitry operative to combine samples stored on the first and second capacitors, and to generate a digital output signal using the combined samples during a conversion time interval distinct from the sampling time interval,
wherein the circuitry is operative to perform an analog-to-digital conversion operation to generate the digital output signal by operating on charge sampled and stored on the first and second capacitors during the sampling time interval.

2. The circuit of claim 1, wherein the circuitry is operative to combine the samples by connecting the first and second capacitors in a manner such that charge is shared amongst the first and second capacitors.

3. The circuit of claim 1, wherein:
the first capacitor is formed of two or more sub-capacitors;
wherein the circuitry is operative to adjust the connectivity of the capacitors and/or sub-capacitors from a first configuration during the sampling time interval to a second configuration during the conversion time interval so as to generate a first bit of the digital output signal using a combined sample stored on a first sub-capacitor of the first capacitor and generate a second bit of the digital output signal using a combined sample stored on a second sub-capacitor of the first capacitor.

4. The circuit of claim 3, wherein the second configuration of capacitors and/or sub-capacitors of the conversion time interval connects the capacitors and/or sub-capacitors into first and second sets of capacitors and sub-capacitors wherein the first set of capacitors has twice the capacitance value of the second set of capacitors.

5. The circuit of claim 1, wherein the first and second capacitors and the circuitry operative to generate the digital output signal form part of a successive approximation analog-to-digital converter configured to generate a first bit of the digital output signal based at least in part on the combination of charge stored on the first and second capacitors.

6. The circuit of claim 1, wherein the first and second capacitors and the circuitry operative to generate the digital output signal form part of a pipelined analog-to-digital converter configured to generate a first bit of the digital output signal based at least in part on the combination of charge stored on the first and second capacitors.

7. The circuit of claim 1, wherein the circuitry is operative to perform a first analog-to-digital conversion operation based at least in part on the sample of the first capacitor to generate a first bit of the digital output signal, and to perform a second analog-to-digital conversion operation based at least in part on the sample of the second capacitor to generate a second bit of the digital output signal.

8. The circuit of claim 1, further comprising:
a third capacitor for sampling the analog input signal at a third time during the sampling time interval, wherein the third time is distinct from the first and second times,
wherein the circuitry is operative to combine the samples on the first, second, and third capacitors, and to generate the digital output signal using the combined samples during the conversion time interval, and
wherein the first, second, and third times are evenly spaced in time during the sampling time interval.

9. The circuit of claim 1, wherein the circuitry is operative to perform a finite impulse response (FIR) filtering operation of the analog input signal as part of generating the digital output signal, and wherein a filter characteristic of the FIR filtering operation is determined at least in part by the relative sizes of the first and second capacitors.

10. The circuit of claim 1, wherein the circuitry generates the digital output signal by performing steps of:
combining charge stored on the first and second capacitors; and
subsequent to combining the charge stored on the first and second capacitors, operating on the combined charge to generate the digital output signal.

11. A method comprising:
sampling, by a first capacitor, an analog input signal at a first time during a sampling time interval;

sampling, by a second capacitor, the analog input signal at a second time during the sampling time interval, wherein the second time is distinct from the first time;
combining the samples taken at the first and second times; and
generating a digital output signal using the combined samples during a conversion time interval distinct from the sampling time interval,
wherein the step of generating the digital output signal comprises performing an analog-to-digital conversion operation on charge sampled and stored on the first and second capacitors during the sampling time interval.

12. The method of claim 11, wherein:
the first capacitor is formed of two or more sub-capacitors;
the combining comprises combining the samples by adjusting the connectivity of the capacitors and/or sub-capacitors from a first configuration during the sampling time interval to a second configuration during the conversion time interval; and
the generating comprises generating a first bit of the digital output signal using a combined sample stored on a first sub-capacitor of the first capacitor and generating a second bit of the digital output signal using a combined sample stored on a second sub-capacitor of the first capacitor.

13. The method of claim 12, wherein the second configuration of capacitors and/or sub-capacitors of the conversion time interval connects the capacitors and/or sub-capacitors into first and second sets of capacitors and sub-capacitors wherein the first set of capacitors has twice the capacitance value of the second set of capacitors.

14. The method of claim 11, wherein the steps of sampling, combining, and generating are performed in a successive approximation analog-to-digital converter configured to generate a first bit of the digital output signal based at least in part on the combination of charge stored on the first and second capacitors.

15. The method of claim 11, wherein the steps of sampling, combining, and generating are performed in a pipelined analog-to-digital converter configured to generate a first bit of the digital output signal based at least in part on the combination of charge stored on the first and second capacitors.

16. The method of claim 11, wherein the step of generating the digital output signal comprises performing a first analog-to-digital conversion operation based at least in part on the combined sample of the first capacitor to generate a first bit of the digital output signal, and performing a second analog-to-digital conversion operation based at least in part on the combined sample of the second capacitor to generate a second bit of the digital output signal.

17. The method of claim 11, further comprising:
sampling, by a third capacitor, the analog input signal at a third time during the sampling time interval, wherein the third time is distinct from the first and second times,
wherein the combining comprises combining the samples on the first, second, and third capacitors, and
wherein the first, second, and third times are evenly spaced in time during the sampling time interval.

18. The method of claim 11, wherein the combining of the samples and the generating of the digital output signal circuitry are operative to perform a finite impulse response (FIR) filtering operation of the analog input signal, and wherein a filter characteristic of the FIR filtering operation is determined at least in part by the relative sizes of the first and second capacitors.

19. The method of claim 11, wherein the step of generating the digital output signal comprises steps of:

combining charge stored on the first and second capacitors; and
subsequent to combining the charge stored on the first and second capacitors, operating on the combined charge to generate the digital output signal.

20. A method comprising:
selecting first and second sets of capacitors in a capacitor array, wherein a ratio of capacitance values of the first and second sets of capacitors corresponds to a ratio between tap coefficients of a desired anti-aliasing filter response;
sampling an analog input signal at first and second distinct times during a sampling time interval respectively using the first and second sets of capacitors to obtain first and second samples of the analog input signal;
re-configuring the capacitors forming the first and second sets of capacitors to form third and fourth sets of capacitors different from the first and second sets of capacitors; and
outputting a digital output signal based on charge stored on the third and fourth sets of capacitors, wherein the digital output signal includes a first bit based on conversion of a charge stored on the capacitors of the third set of capacitors and a second bit based on conversion of a charge stored on the capacitors of the fourth set of capacitors.

21. The method of claim 20, wherein the steps for selecting the first and second sets of capacitors and for sampling the analog input signal comprise:
for each selected set of the first and second sets of capacitors, sequentially performing steps of:
for each capacitor in the selected set of capacitors, sequentially performing steps of activating a row selection line and a column selection line corresponding to a row and column of the capacitor in the array while maintaining a data line in a first state; and
following the activating of the row and column selection lines for each capacitor in the selected set, applying the analog input signal to a signal line to sample the analog input signal on the capacitors of the selected set.

22. The method of claim 20, wherein the desired anti-aliasing filter response is a FIR filter response.

23. The method of claim 20, further comprising:
selecting a fifth set of capacitors in the capacitor array,
wherein capacitors of the fifth set of capacitors store an average of the samples stored on the first and second sets of capacitors during a previous sampling time interval,
wherein the re-configuring of the capacitors comprises combining the capacitors forming the first, second, and fifth sets of capacitors to form the third and fourth sets of capacitors, and
wherein the capacitors are re-configured such that capacitance ratios between the first, second, and fifth sets of capacitors correspond to ratios between tap coefficients of a desired IIR filter response.

24. The method of claim 20, further including a storage element for storing a quantity representative of a historical value of an input, wherein the desired anti-aliasing filter response is a IIR filter response.

25. The method of claim 20, wherein the re-configuring of the capacitors forming the first and second sets of capacitors to form third and fourth sets of capacitors is performed subsequent to the sampling of the analog input signal at first and second distinct times during the sampling time interval respectively using the first and second sets of capacitors.

26. A circuit comprising:

a capacitor array comprising a plurality of capacitors and selection circuitry for selectively coupling array capacitors together to form sets of capacitors;

a converter for converting an average charge value stored on a set of capacitors to a bit value of a digital output signal; and a controller for controlling the operation of the capacitor array and the converter, wherein the controller is configured to:

select first and second sets of capacitors in the capacitor array, wherein a ratio of capacitance values of the first and second sets of capacitors corresponds to a ratio between tap coefficients of a desired anti-aliasing filter response;

sample an analog input signal at first and second distinct times during a sampling time interval respectively using the first and second sets of capacitors to obtain first and second samples of the analog input signal;

re-configure the capacitors forming the first and second sets of capacitors to form third and fourth sets of capacitors different from the first and second sets of capacitors; and output the digital output signal based on charge stored on the third and fourth sets of capacitors, wherein the digital output signal includes a first bit based on conversion of a charge stored on the capacitors of the third set of capacitors and a second bit based on conversion of a charge stored on the capacitors of the fourth set of capacitors.

27. The circuit of claim 26, wherein the controller is configured to select the first and second sets of capacitors and sample the analog input signal by:

for each selected set of the first and second sets of capacitors, sequentially performing steps to:

for each capacitor in the selected set of capacitors, sequentially perform steps of activating a row selection line and a column selection line corresponding to a row and column of the capacitor in the array while maintaining a data line in a first state; and following the activating of the row and column selection lines for each capacitor in the selected set, apply the analog input signal to a signal line to sample the analog input signal on the capacitors of the selected set.

28. The circuit of claim 26, wherein the desired anti-aliasing filter response is a FIR filter response.

29. The circuit of claim 26, wherein the controller is further configured to:

select a fifth set of capacitors in the capacitor array, wherein capacitors of the fifth set of capacitors store an average of the samples stored on the first and second sets of capacitors during a previous sampling time interval, wherein the re-configuring of the capacitors comprises combining the capacitors forming the first, second, and fifth sets of capacitors to form the third and fourth sets of capacitors, and wherein the capacitors are re-configured such that capacitance ratios between the first, second, and fifth sets of capacitors correspond to ratios between tap coefficients of a desired IIR filter response.

30. The circuit of claim 26, further including a storage element for storing a quantity representative of a historical value of an input, wherein the desired anti-aliasing filter response is a IIR filter response.

* * * * *